US010361349B2

(12) United States Patent
Andrews et al.

(10) Patent No.: US 10,361,349 B2
(45) Date of Patent: Jul. 23, 2019

(54) LIGHT EMITTING DIODES, COMPONENTS AND RELATED METHODS

(71) Applicant: Cree, Inc., Durham, NC (US)

(72) Inventors: Peter Scott Andrews, Durham, NC (US); Joseph G. Clark, Raleigh, NC (US); Troy Gould, Raleigh, NC (US); Erin R. F. Welch, Ann Arbor, MI (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/694,591

(22) Filed: Sep. 1, 2017

(65) Prior Publication Data

US 2019/0074417 A1  Mar. 7, 2019

(51) Int. Cl.
*H01L 33/62* (2010.01)
*H01L 33/60* (2010.01)
*H01L 33/56* (2010.01)
*H01L 23/00* (2006.01)
*H01L 25/075* (2006.01)
*H01L 33/50* (2010.01)

(52) U.S. Cl.
CPC .............. *H01L 33/60* (2013.01); *H01L 24/48* (2013.01); *H01L 25/0753* (2013.01); *H01L 33/505* (2013.01); *H01L 33/56* (2013.01); *H01L 33/62* (2013.01); *H01L 2224/48137* (2013.01); *H01L 2924/12041* (2013.01); *H01L 2933/005* (2013.01); *H01L 2933/0033* (2013.01); *H01L 2933/0058* (2013.01)

(58) Field of Classification Search
CPC ....................................................... H01L 33/60
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |

(Continued)

FOREIGN PATENT DOCUMENTS

| | | |
|---|---|---|
| EP | 2 221 885 A1 | 8/2010 |
| EP | 2 750 211 A2 | 7/2014 |

(Continued)

OTHER PUBLICATIONS

International Search Report and Written Opinion for Application No. PCT/US2018/048540 dated Nov. 28, 2018.

*Primary Examiner* — William A Harriston
(74) *Attorney, Agent, or Firm* — Jenkins, Wilson, Taylor & Hunt, P.A.

(57) ABSTRACT

Light emitting diode components and devices with a wall of reflective material and having improved performance and beam angle, are provided. Reflective material provided with light emitting diode devices is configured to optimize light reflectivity by altering the composition, thickness, placement and/or angle thereof. Methods of making and assembly light emitting diode components and devices with reflective materials and improved performance, are also provided.

22 Claims, 20 Drawing Sheets

(56) References Cited

U.S. PATENT DOCUMENTS

| | | |
|---|---|---|
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van de Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van de Ven et al. |
| 8,044,418 B2 | 10/2011 | Loh et al. |
| 8,125,137 B2 | 2/2012 | Medendorp, Jr. et al. |
| 8,264,138 B2 | 9/2012 | Negley et al. |
| 8,337,071 B2 | 12/2012 | Negley et al. |
| 8,410,679 B2 | 4/2013 | Ibbetson et al. |
| 8,425,271 B2 | 4/2013 | Hussell et al. |
| 8,563,339 B2 | 10/2013 | Tarsa et al. |
| 8,729,589 B2 | 5/2014 | Hussell et al. |
| 8,866,410 B2 | 10/2014 | Negley et al. |
| 8,970,131 B2 | 3/2015 | Brandes et al. |
| 9,024,349 B2 | 5/2015 | Chitnis et al. |
| 9,131,561 B2 | 9/2015 | Athalye |
| 9,159,888 B2 | 10/2015 | Chitnis et al. |
| 9,277,605 B2 | 3/2016 | Ni |
| 9,414,454 B2 | 8/2016 | Brandes et al. |
| 2006/0221272 A1 | 10/2006 | Negley et al. |
| 2007/0104828 A1 | 5/2007 | Fornaguera |
| 2009/0050908 A1 | 2/2009 | Yuan et al. |
| 2011/0068702 A1 | 3/2011 | Van de Ven et al. |
| 2012/0319150 A1 | 12/2012 | Shimomura et al. |
| 2013/0221380 A1* | 8/2013 | Ankireddi ........... H01L 25/0753 257/88 |
| 2013/0256711 A1 | 10/2013 | Joo et al. |
| 2014/0027795 A1 | 1/2014 | Reiherzer et al. |
| 2015/0050760 A1 | 2/2015 | Imazu et al. |
| 2015/0257211 A1 | 9/2015 | Johnson et al. |
| 2015/0267906 A1 | 9/2015 | Wilcox |
| 2017/0084587 A1 | 3/2017 | Hung et al. |
| 2017/0117446 A1 | 4/2017 | Tsuchiya et al. |

FOREIGN PATENT DOCUMENTS

| | | |
|---|---|---|
| EP | 3 273 941 A1 | 1/2018 |
| JP | 2016-174148 A | 9/2016 |

* cited by examiner

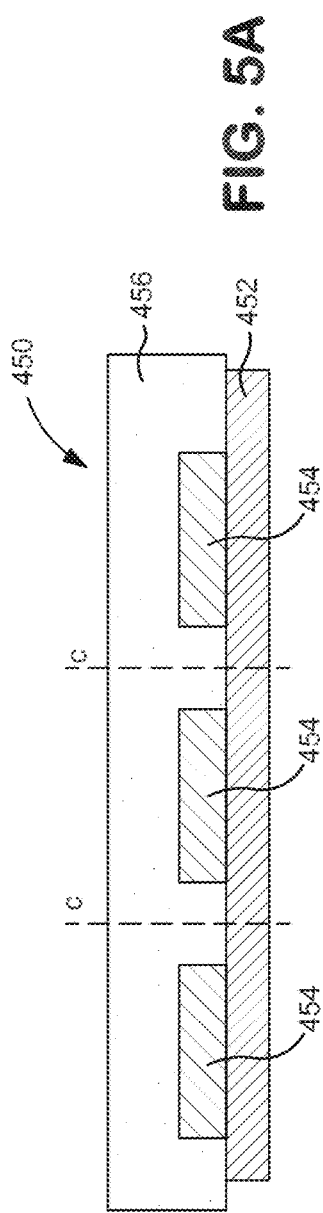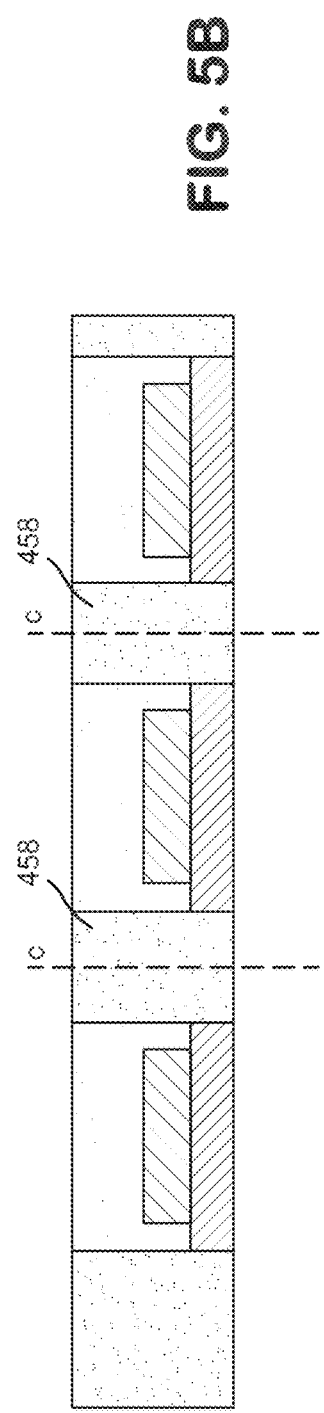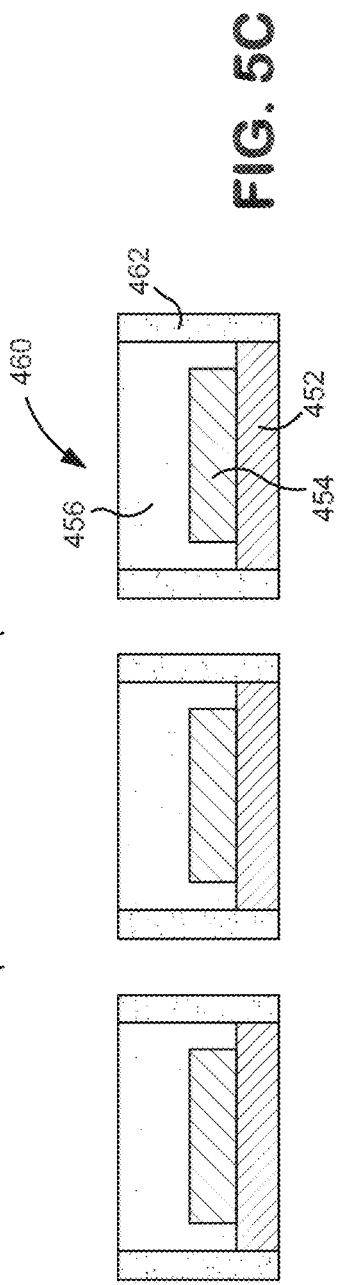

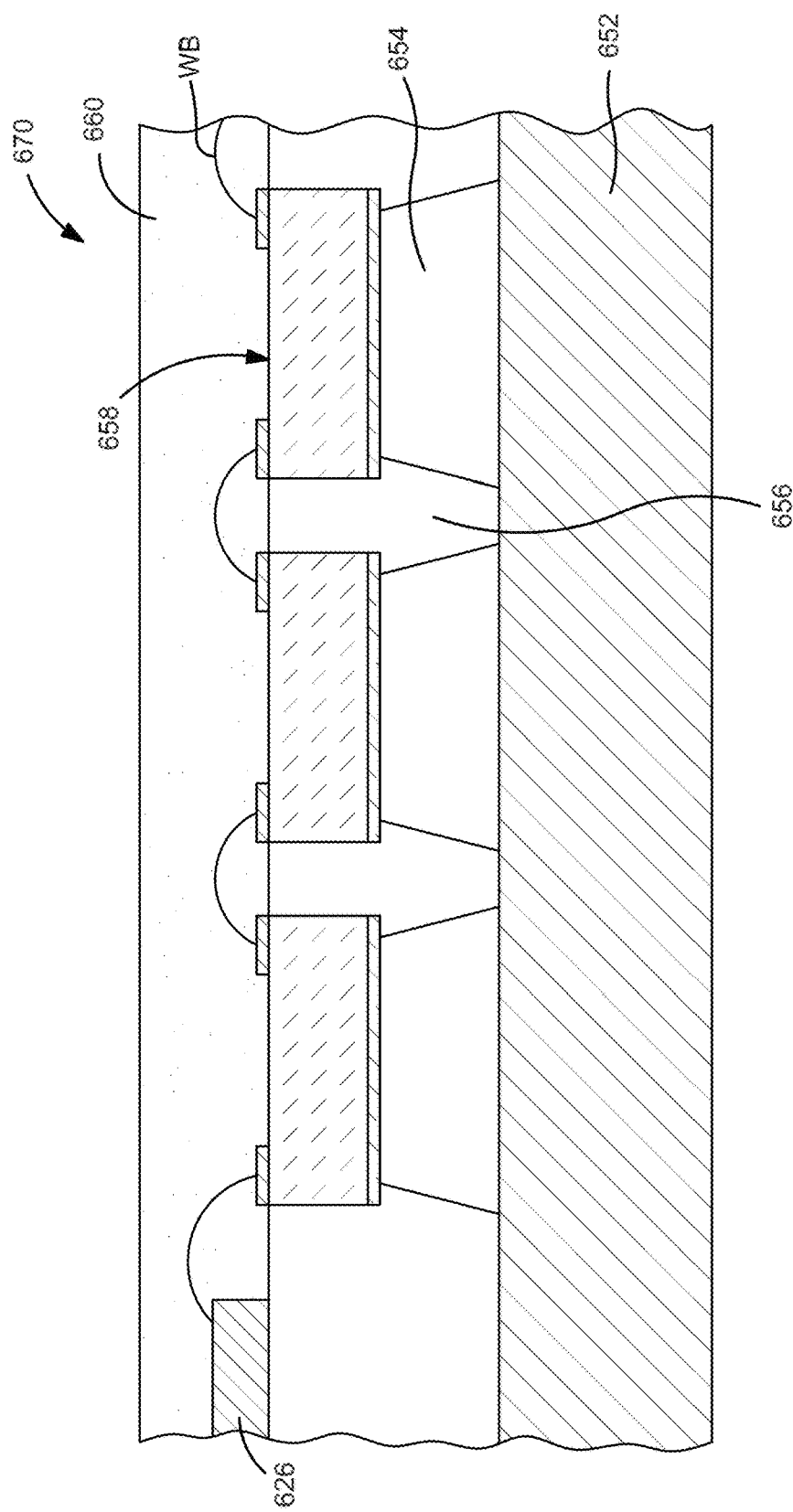

LIGHT EMITTING DIODES, COMPONENTS AND RELATED METHODS

TECHNICAL FIELD

The subject matter disclosed herein relates generally to light emitting diodes (LEDs), components, and related methods. More particularly, the subject matter disclosed herein relates to devices, components, systems and methods utilizing die configurations and components to improve emission patterns and lighting performance.

BACKGROUND

Light emitting diodes or LEDs are solid state devices that convert electrical energy into light. LEDs can be utilized in light emitter devices or components for providing different colors and patterns of light useful in various lighting and optoelectronic applications. Light emitter devices can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers and encourage the adoption of LED products. Devices and components incorporating fewer raw materials at sustained or increased brightness levels are desired. Moreover, LEDs that produce light at optimal outputs and under enhanced performance, particularly while using the same or less power, are becoming more desirable.

Thus, despite the availability of various light emitter devices and components in the marketplace, a need remains for devices, components, and methods that can be produced quickly, efficiently, at a lower cost, and with improved performance characteristics.

SUMMARY

In accordance with this disclosure, substrate based LEDs, components, and related methods having improved manufacturability and customization are provided and described herein. Devices, components, and methods described herein can advantageously exhibit improved processing times, ease of manufacture, and/or lower processing costs. Devices, components, and related methods described herein can be well suited for a variety of applications such as personal, industrial, and commercial lighting applications including, for example, light bulbs and light fixture products and/or applications. In some aspects, devices, components, and related methods described herein can comprise improved (e.g., less expensive and more efficient) manufacturing processes and/or improved optical properties including consistent and uniform light emission and color.

Solid state lighting apparatuses, such as LEDs, systems, and related methods are provided. An example apparatus can comprise, for example: a submount; one or more LEDs, and a reflective material (also referred to as a white wall). LED devices and components disclosed herein can have a beam angle of a light output that is substantially reduced to thereby improve light emission and output characteristics.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which:

FIGS. 5A through 5C are cross-sectional views of LED components and devices;

FIGS. 11A and 11B are cross-sectional views of LED components and devices as disclosed herein;

DETAILED DESCRIPTION

Figure 1A:
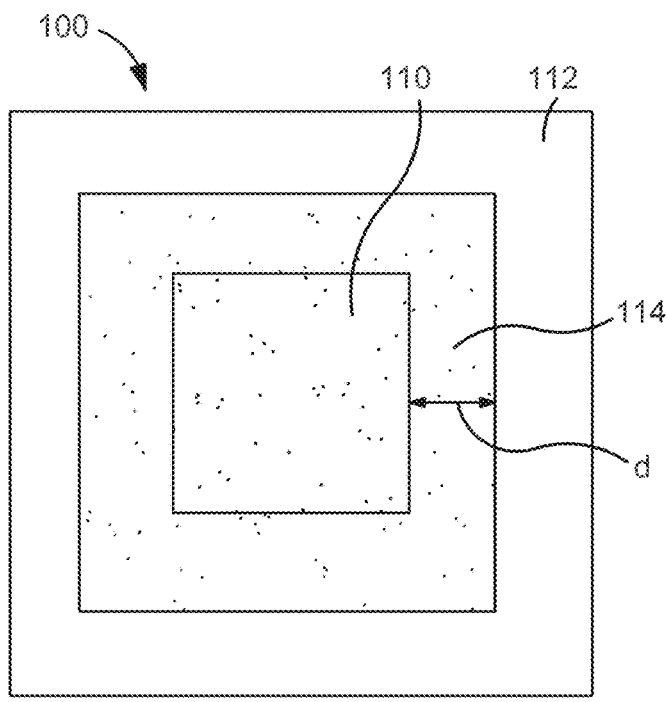
FIGS. 1A through 1D are schematic illustrations of embodiments of LED devices disclosed herein, with FIG. 1A being a top view of a LED device, FIG. 1B a profile view of the LED device of FIG. 1A, and FIGS. 1C and 1D cross-sectional views of LED devices.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including, for example, but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to a LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g., driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. Apparatuses, systems, and methods herein can utilize, for example, ultraviolet (UV) chips, cyan chips, blue chips, green chips, red chips, amber chips, and/or infrared chips.

The term "substrate" or "submount" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., a LED substrate), or a sub-panel substrate. Exemplary substrates useful with lighting apparatuses as described herein can, for example, comprise printed circuit boards (PCBs) and/or related components (e.g., including but not limited to metal core printed circuit boards (MCPCBs), flexible circuit boards, dielectric laminates, ceramic based substrates, and the like), ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LEDs or laser chips fabricated on a silicon, silicon carbide, sapphire, or III-V nitride growth substrate, including (for example) LEDs manufactured and sold by Cree, Inc. of Durham, N.C. Such LEDs and/or lasers can be configured to operate such that light emission occurs through the substrate in a so-called "flip chip" orientation. Such LED and/or laser chips can also be devoid of growth substrates (e.g., following growth substrate removal). In some cases, LEDs can comprise red—III-V chips, but not nitride such as InGaAlP, GaAsP, and the like.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cya LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can comprise one or more of a wide variety of wavelength conversion materials or color conversion components including luminescent materials. Examples of luminescent materials (lumiphors) include phosphors, Cerium-doped Yttrium Aluminum Garnet (YAG) (e.g., LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to different embodiments of LED package structures having a light source that comprises LEDs. The LED packages can be arranged in different ways and are relatively small, while at the same time are efficient, reliable and cost effective. The embodiments according to the disclosure herein can have different shaped encapsulants, but can emit with improved or similar efficiency compared to similar LED packages with fully hemispheric encapsulants. In some embodiments, where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein can, in some embodiments, be directed to a number of different features and arrangements that can improve or tailor the emission characteristics of LED packages and devices according to the disclosure herein. These can include, but are not limited to, improved luminal output and reduced beam angle of a light output from the LED devices. Such devices also can have improved efficiency and reliability, as well as higher outputs. In some embodiments, the use of some or all of these features can result in LED packages emitting light at improved lumen density.

The disclosure herein is described herein with reference to certain embodiments, but it is understood that the disclosure herein can be embodied in many different forms and should not be construed as limited to the embodiments set forth herein. In particular, the disclosure herein is described below in regards to certain LED packages having LEDs in different configurations, but it is understood that the disclosure herein can be used for many other LED packages with other LED configurations. The LED packages can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to a LED or LEDs, but in accordance with the disclosure herein and, in some aspects, LEDs as used herein can include LED chips, dies or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that a LED light source may be comprised of multiple LEDs that may have different emission wavelengths. As mentioned above, in some embodiments, at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

The terms "electrically activated emitter(s)" and "emitter(s)" as used herein are synonymous terms and refer to any device capable of producing visible or near visible (e.g., from infrared to ultraviolet) wavelength radiation, including, for example, but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LED chips are electrically connected, such as in series, in parallel, in mixed series/parallel, in common anode, or in common anode configurations among mutually exclusive groups/segments/sets. The segments of LED chips can be configured in a number of different ways and may have circuits of varying functionality associated therewith (e.g., driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Wavelength conversion materials, including those incorporated into wavelength conversion components as disclosed herein, can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

As described herein, one or more LED chips can be at least partially covered with a wavelength conversion component comprising one or more phosphors and/or one or more layers of phosphors on a clear substrate, such as, for example, sapphire. In some embodiments, such wavelength conversion components can be referred to as a phosphor-sapphire hat, or Phos hat. Phosphors can be adapted to emit blue light, yellow light, green light, red light, or any combination(s) thereof upon being impinged with light emitted via one or more LED chips. That is, in some aspects, one or more phosphors in the Phos hat can absorb a portion of light emitted by the LED chip and in-turn reemit the absorbed light at a different wavelength such that the light emitter device or component emits a combination of light from each of the LED chip(s) and the phosphor(s). In one embodiment, the light emitter devices and components described herein can emit what is perceived as white light resulting from a combination of light emission from the LED chip and the Phos hat. In one embodiment according to the present subject matter, white emitting devices and components can consist of an LED chip that emits light in the blue wavelength spectrum and a phosphor in the Phos hat that absorbs some of the blue light and re-emits light in the green, yellow, and/or red wavelength spectrum. The devices and components can therefore emit a white light combination across the visible spectrum of light. In other embodiments, the LED chips with a wavelength conversion component, e.g., a Phos hat, can emit a non-white light combination of blue and yellow light as described in U.S. Pat. No. 7,213,940. LED chips emitting red light or LED chips covered by a phosphor of a Phos hat that absorbs LED light and emits a red light is also contemplated herein.

Wavelength conversion components or Phos hats used in some embodiments, with the disclosed LED components and devices can be made or assembled in any suitable manner. In some embodiments, such wavelength conversion components are produced by applying phosphor only on one surface of the Phos hat so that in assembly of an LED device or component the light affecting material (i.e., heavy scatterer to turn light) is right against or substantially adjacent to the Sapphire or Phos hat substrate, giving a clean edge for meniscus control.

In some embodiments, such wavelength conversion components are produced by spraying a substrate, e.g., LED chip, singulated on tape or other release material in a slightly spaced manner, which can allow for some phosphor to be applied on the sidewall of the substrate to form a Phos hat. This approach can, in some aspects, be useful where white-$TiO_2$ light affecting material is not used or is applied prior to placing of the Phos hat, which can, in some embodiments, avoid blue light escaping from sides of a Phos hat.

In some embodiments, substrate wafers can be sprayed, either above room temperature, i.e., hot, or at room temperature, to make the Phos hats. In some aspects, it is suitable to spray the wafer at room temperature, followed by curing and then singulating of the die on the wafer.

Other benefits of wavelength conversion materials (e.g., phosphor, P) used in wavelength conversion components as disclosed herein, include, for example, improved far field images (e.g., thereby promoting a very uniform color appearance in the far field with a larger viewing angle), lower color shifts (lower dCCT), improved long term reliability (e.g., improved brightness maintenance (optics) at approximately 1000 hours or more), higher product ratings, cooler phosphor operating temperatures, and/or a lower color point spread, including all or any combination of such features.

Phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths.

Phosphors can, in some embodiments, be included in an encapsulant used on an LED device. The phosphor can emit radiation in the visible spectrum having lower energy than the radiation emitted by a light emitter and does so in response to the wavelength emitted by the emitter. Combinations of phosphors can be used in conjunction with the blue or UV-emitting chip/LED to create white light; e.g., blue and yellow, blue and green and red, and blue and green and yellow and red. Using three or more colors can provide an opportunity to select a particular white point and a better color rendering. It is also expected that LEDs with more than one emission peak will be useful in exciting one or more phosphors to produce white light.

Phosphors and/or phosphor compounds can be selectively added and/or applied in any desired amount or quantity to clear or substantially clear substrates, wafers or sheets of material. Application of the phosphor and/or phosphor compounds can be achieved via any suitable method including, for example, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including, for example, as described in U.S. Pat. No. 8,410,679 to Ibbetson et al., and U.S. Pat. No. 8,425,271 to Hussell et al., the disclosures of which are each hereby incorporated by reference herein in their entireties. In some embodiments, the phosphor compound applied to a clear substrate, e.g., sapphire wafer, is conformal to the shape and/or surface of the clear substrate. That is, a conformal layer of phosphor or phosphor compound can, for example, have an at least substantially uniform thickness.

The thickness of phosphor compound and/or phosphor layer on the clear substrate can, for example, range between approximately 2 μm and approximately 100 μm, however, any thickness of phosphor compound on the wavelength conversion component can be provided as desired. The thickness that is used may be selected to reduce or minimize blue light conversion in a planar surface, self-absorption and/or scattering, and may depend on the coating process, the density of the phosphor, other components in the phosphor compound, e.g., silicone, and/or the desired application.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Provided herein are LED die, including, for example, wafer level packaging (WLP) with sapphire, incorporating a wrap around reflector material to create a planar light emitting surface. Currently available LED die have a large amount of light that is too high angle for most applications. By arranging and/or wrapping a $TiO_2$/silicone matrix, also referred to as a wall, sidewall, reflective wall, or white wall, on a periphery of a LED die to create sidewalls such die can be configured to reflect light to the surface to thereby optimize a light angle. In some embodiments, the reflective sidewalls can be configured to extend to the side walls of a glass hat on a LED. Moreover, in some aspects, the reflective wall can be tuned to be optically thick, or can be tuned to allow a certain amount of light leakage by adjusting the percent of fill material, e.g., $TiO_2$, or adjusting the thickness of the reflective material.

In some embodiments, a combination of black and white, or any other desirable color or shade, can be configured in layers either horizontally or vertically in the reflective walls surrounding the LED to maximize brightness (reflectivity of sidewall) and glare reduction when viewed from the top. Moreover, the walls of reflective material can be configured with shallow, straight or bevel cuts as part of a sidewall singulation step to further enhance light control such as adding a black top layer. In some embodiments, the reflective wall material can further include a phosphorous material or other filtering material to alter the light emission characteristics of the sidewall.

The disclosed LED die can be configured for a wide range of applications, including any LED component wherein the disclosed LEDs could serve as a LED component building block. By way of example and not limitation, such LEDs could be used in video signage in black and white. By providing a small footprint and the ability to be top emitting with high efficiency, coupled with the capability of a black top surface for video type board, a very readable black and white video signage could be produced which would be readable from a long distance (due to high power available) as well as having relatively small pixel packing for the power output. Such LEDs can be configured with a flat square top which can be conducive for mating to light piping (edge distribution, for example) applications as well.

In some embodiments provided herein are devices, systems and methods where a LED is mounted directly onto a metal substrate to optimize heat transfer, coupled with a reflective wall as disclosed herein, such that wire bonding of the LED can be achieved after application of the reflective wall. Such embodiments addresses an unmet need in that the LEDs in such a package can be powered to their maximum limit to achieve the highest output possible without reliability suffering. By maximizing heat transfer and optimizing light paths such results can be achieved.

In some embodiments the LED devices and components disclosed herein obviate the need for expensive Alanod type substrates, thus significantly reducing the cost of the LED devices and components. Moreover, this can allow for the use of high reliability and long term optical grade silicones to handle the light.

Such LED devices and components can be used in a wide range of applications as they can serve as a LED component building block like other LED components.

Thus, in some embodiments provided herein is a LED device comprising a submount comprising an upper surface and a bottom surface, a LED disposed on the upper surface of the submount, the LED comprising an upper surface and one or more sides, an encapsulant surrounding the LED by being disposed on the upper surface and one or more sides of the LED, and a reflective wall surrounding the encapsulant that surrounds the LED, wherein at least a portion of an upper surface of the reflective wall is substantially coplanar with at least a portion of an upper surface of the encapsulant. In some aspects, the surface area of the floor of the LED device is substantially equal to or greater than the surface area of the upper surface of the LED or die. In some aspects, the reflective wall comprises $TiO_2$ and silicone, or primarily $TiO_2$ in silicone, wherein the ratio of $TiO_2$:silicone in the reflective wall is about 1:1, or in a range between and including about 1:1 and about 3:1. In some embodiments, the reflective wall, or other light scatterers, can comprise fumed silica, or a fused-silica, as a scatterer along with $TiO_2$, which in some embodiments can change the viscosity and/or flow properties. In some embodiments, a beam angle of a light output from the LED device is substantially reduced, particularly as compared to a LED device without the reflective wall, and can, for example, have a beam angle of about 115° or less. In some embodiments, a substantial reduction in beam angle can comprise an about 10° to about 20° reduction. Beam angle can in some embodiments be measuring using the full width half maximum (FWHM) approach, where the angle is defined, in relative terms, for a symmetrical optics with its maximum intensity in the middle of its light distribution (horizontal and vertical 0 degree), to be the angle, where the intensity of illumination has dropped to 50% from its maximum peak value.

In some embodiments provided herein is a LED device comprising a singulated die positioned on a package wafer, an encapsulant surrounding the singulated die, and a reflective wall surrounding the encapsulant that surrounds the singulated die, wherein at least a portion of an upper surface of the reflective wall is substantially coplanar with at least a portion of an upper surface of the encapsulant. In some aspects, the reflective wall comprises $TiO_2$ and silicone, wherein the ratio of $TiO_2$:silicone in the reflective wall is about 1:1, or in a range between and including about 1:1 and about 3:1. In some embodiments, a beam angle of a light output from the LED device is substantially reduced, particularly as compared to a LED device without the reflective wall, and can, for example, have a beam angle of about 115° or less.

In some embodiments, methods of making a LED device are provided herein, including, for example, providing a substrate, attaching a die to the substrate, applying an encapsulant on an upper surface of the die and/or substrate, singulating the die attached to the substrate to form separate die components, mounting the singulated die components to a release substrate, applying a reflective material to surround the singulated die components, and cutting through the reflective material to singulate the die components to provide a LED device surrounded by a wall of reflective material.

In some embodiments, such methods can comprise providing a substrate, attaching a die to the substrate, applying an encapsulant on an upper surface of the die and/or substrate, singulating the die attached to the substrate by a first cutting through the encapsulant up to the substrate to form a channel separating die components along the substrate, applying a white wall material to surround the singulated die components, and cutting through the white wall material and the substrate by a second cutting to singulate the die components to provide a LED device surrounded by white wall material.

In some embodiments, such a method can comprise providing a substrate, attaching a plurality of die to the ceramic substrate, applying an encapsulant on an upper surface of the plurality of die and/or the ceramic substrate in a flat mold, singulating the die attached to the ceramic substrate to form separate die components, arranging the separate die components into an array in a mold, flooding a space around the arranged die components in the array with a reflective material to surround the singulated die components, and cutting through the reflective material around the die components to singulate the die components to provide a LED device comprising a die component surrounded by a wall of reflective material.

In some embodiments, a method of making a LED device comprises providing a plurality of LED chips, wherein each of the plurality of LED chips comprise an upper surface, a lower surface, and one or more sides, applying the one or more LED chips to a thermal release tape in a mold, wherein the LED chips are applied with the upper surface facing down, flooding the LED chips in the mold with a reflective material to surround the one or more sides of the LED chips with the reflective material, curing the reflective material to form a puck of reflective material with LED chips embedded therein, removing the puck from the thermal release tape and applying the puck to a substrate to form a LED device comprising a plurality of spaced apart LED chips surrounded by reflective material.

A method of making a LED device, such as, for example, the methods described hereinabove, can also comprise providing a die positioned on a package wafer, shaping an outer edge of the die on the package wafer using a blade, and applying a reflective material around the shaped outer edge of the die on the packaged wafer to create a wall of reflective material.

In some embodiments provided herein is a light emitting diode (LED) device comprising a submount comprising an upper surface and a bottom surface, a LED disposed on the upper surface of the submount, the LED comprising an upper surface and one or more sides, an encapsulant surrounding the LED by being disposed on the upper surface and one or more sides of the LED, and a reflective wall surrounding the encapsulant that surrounds the LED, wherein at least a portion of an upper surface of the reflective wall is substantially coplanar with at least a portion of an upper surface of the encapsulant. As shown in a top-down view in FIG. 1A, and the perspective view in FIG. 1B, LED device, generally designated 100, comprises a LED 110 surrounded by a reflective wall 112, also referred to herein as a white wall. The space between LED 110 and white wall 112 can be filled with an encapsulant 114. The distance d between LED 110 and white wall 112 can vary as desired, and/or can be tuned to optimize the ratio of the surface area of the floor or exposed submount, i.e., the phosphor-coated submount to the surface area of the LED, as described further below.

Figure 1B:
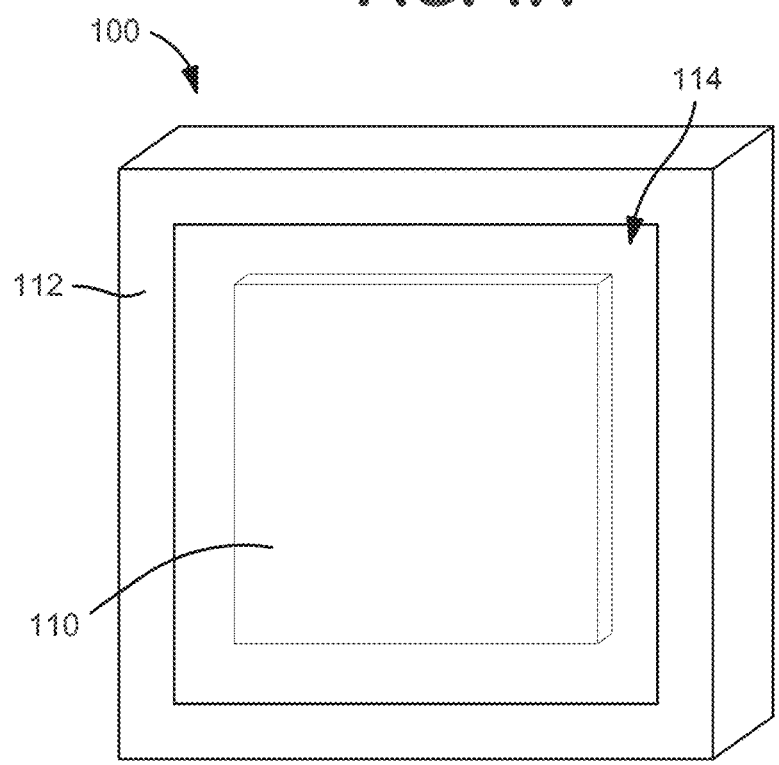
Figure 1C:
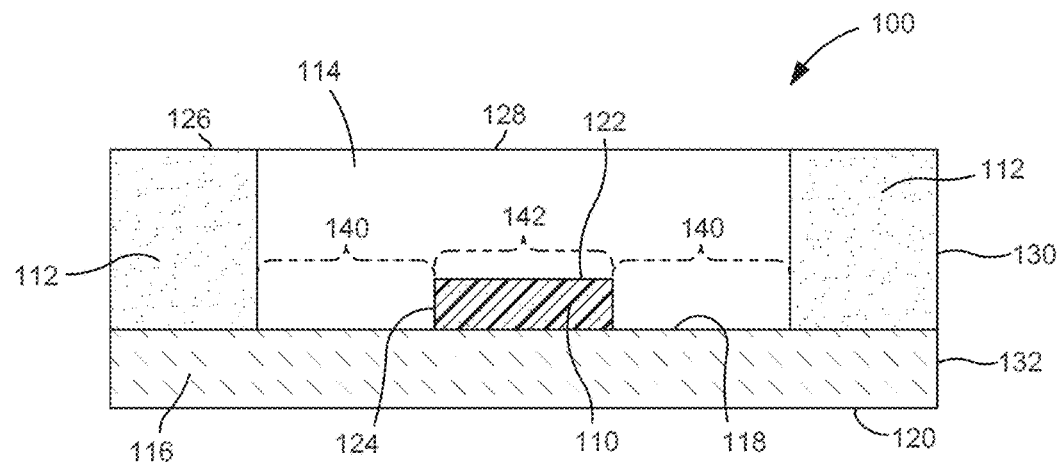
Figure 1D:
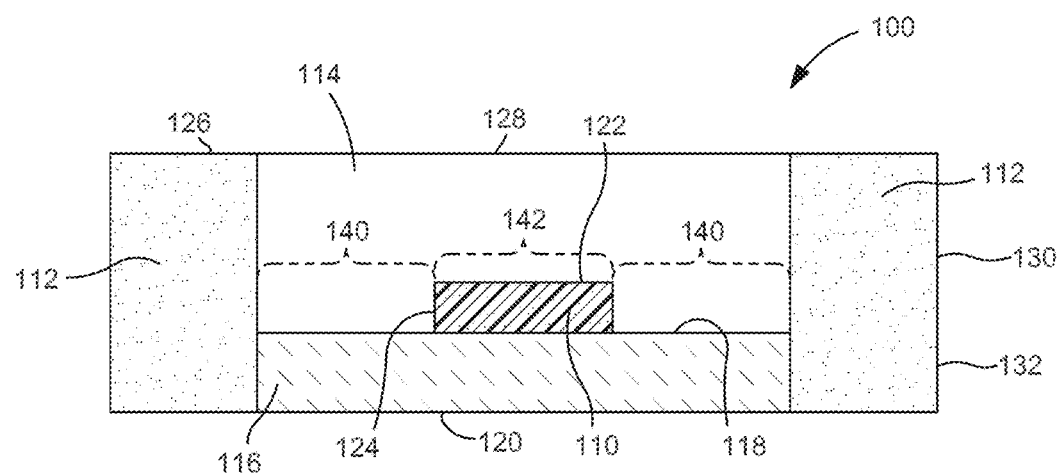

Cross-sectional views of embodiments of the LED device 100 are shown in FIGS. 1C and 1D. LED device 100 comprises a submount 116 (e.g., a substrate) comprising an upper surface 118 and a bottom surface 120, a LED 110 disposed on the upper surface of submount 116, the LED comprising an upper surface 122 and one or more sides 124, an encapsulant 114 surrounding LED 110 by being disposed on (e.g., in contact with) the upper surface 122 and one or more sides 124 of LED 110, and a reflective wall 112, surrounding the encapsulant 114 that surrounds the LED, wherein at least a portion of an upper surface 126 of the reflective wall 112 is substantially coplanar with at least a portion of an upper surface 128 of the encapsulant 114.

In some embodiments, submount 116 can extend beyond the sides 124 of the LED 110, so that the upper surface 118 of submount 116 forms a floor of the LED device 100. In some aspects, the surface area 140 of the floor of the LED device 100 is substantially equal to or greater than the surface area 142 of the upper surface 122 of the LED 110. Alternatively, the ratio of the surface area 140 of the floor to the surface area 142 of the LED can be substantially equal to or greater than 1:1. These relative surface areas can be optimized based, at least in part, on the distance d between the LED 110 and the outer reflective wall 112, as shown in FIG. 1A.

In some embodiments, at least a portion of or all of an outside edge 130 of the reflective wall 112 is substantially coplanar with at least a portion of or all of an outside edge 132 of the submount 116. In such an embodiment, the wall of reflective material 112 is built or applied upon the submount 116. See, e.g., FIG. 1C and FIG. 5. Alternatively, the reflective wall 112 can be disposed around an outside edge 132 of the submount 116. See, e.g., FIG. 1D and FIG. 4.

The encapsulant can comprise any suitable material, including, for example, an epoxy-based or silicone-based curable resin or other polymeric matrix.

Reflective material can be used to reflect light and improve light emission from the LEDs in the disclosed embodiments. The reflective material can be used to form a wall or whitewall (e.g., reflective wall 112) on the disclosed LED devices to optimize light output and emission angles, while allowing for improved performance of the LED devices. Such whitewalls or walls of reflective material, as shown in FIGS. 1A-1D, for example, and in all of the embodiments disclosed herein, can, in some embodiments, comprise $TiO_2$ and silicone, wherein the ratio of $TiO_2$:silicone in the reflective wall 112 can be about 1:1. In some aspects, the ratio of $TiO_2$:silicone in the reflective wall 112 can range between and including about 1:1 and about 3:1. The reflective wall 112 can have a thickness of about 50 μm to about 400 μm. In some embodiments, the reflective wall 112 can have a thickness of about 250 μm and a ratio of $TiO_2$:silicone of about 1:1, with such a configuration providing a reflective wall 112 that can block substantially all light emitted from the LED 110 and directed toward the reflective wall 112.

In some embodiments, the reflective wall 112 can be configured to be optically thick and/or allow light leakage through the reflective wall 112, depending on the optimal light output and performance desired. The reflective wall 112 or whitewall embodiments disclosed herein can be tuned by altering the thickness and/or composition, as noted above. Moreover, in some aspects, the reflective wall 112 can comprise a layer or a plurality of layers of alternating black and white materials configured to optimize reflectivity of light emitted from the LED.

Figure 2A:
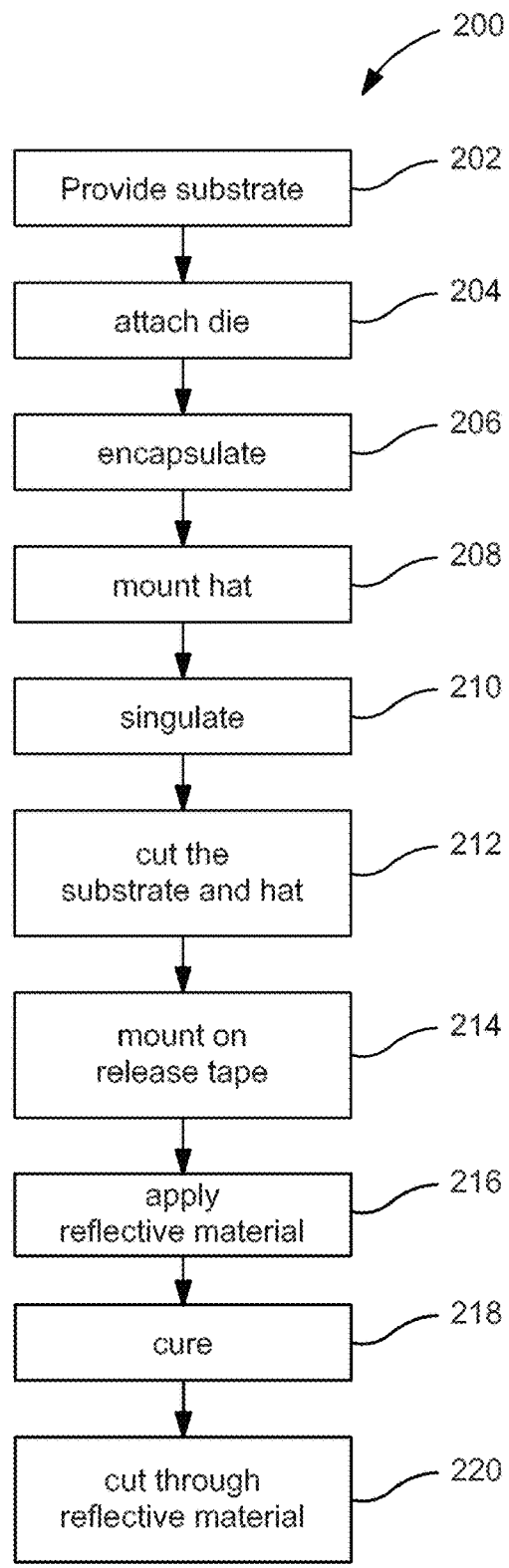
FIGS. 2A and 2B are flow diagrams of example methods for fabricating a LED component.

Turning now to FIG. 2A, in some embodiments, LED devices disclosed herein can be made using some or all of the method steps illustrated in FIG. 2A. For example, a method, generally designated 200, of making a LED device can, in some aspects, comprise providing a substrate 202, attaching a die 204 to the substrate, applying an encapsulant 206 on an upper surface of the die and/or substrate, singulating the die 210 attached to the substrate to form separate die components, mounting the singulated die components to a release substrate 214, applying a reflective material 216 to surround the singulated die components, and cutting through the reflective material 220 to singulate the die components to provide a LED device surrounded by a wall of reflective material. In some embodiments, such a method 200 of making a LED device can, in some aspects, comprise providing a substrate 202, attaching a die 204 to the substrate, applying an encapsulant 206 on an upper surface of the die and/or substrate, mounting a light altering material, such as a phos hat 208, singulating the die 210 attached to the substrate to form separate die components, cutting through the substrate (e.g., ceramic substrate) and phos hat 212, mounting the singulated die components to a release substrate 214, applying a reflective material 216 to surround the singulated die components, and cutting through the reflective material 220 to singulate the die components to provide a LED device surrounded by a wall of reflective material. In the method of FIG. 2A, the substrate can comprise a ceramic substrate, wherein the ceramic substrate can be about 2.5 mm by 2.5 mm. In some embodiments, the release substrate can comprise a thermal release tape configured to releasably secure the components during the LED device build and then release the device upon completion.

Figure 2B:
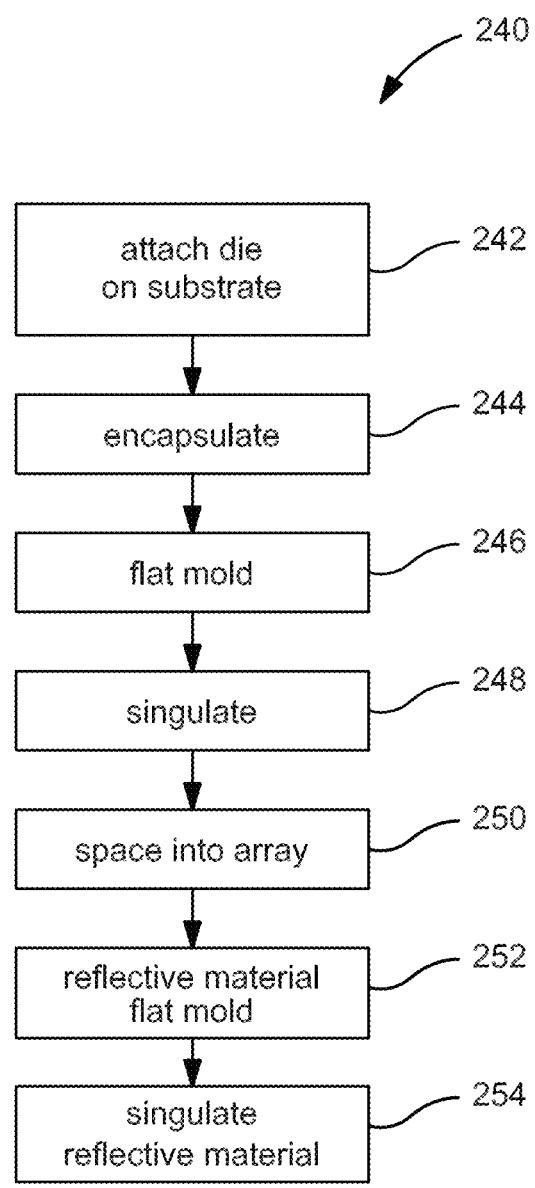

Turning now to FIG. 2B, in some embodiments, LED devices disclosed herein can be made using some or all of the method steps illustrated in FIG. 2B. For example, a method, generally designated 240, of making a LED device can, in some aspects, comprise attaching a die 242 or a plurality of die to a substrate, applying an encapsulant 244 on an upper surface of the die and/or ceramic substrate and molding 246 the encapsulant thereon, e.g., in a flat mold or Towa mold on a 2525 panel with SA1400 asymmetric die, singulating the die 248 attached to the ceramic substrate and encapsulated to form separate die components, arranging the separate die components into an array 250 in a mold, flooding 252 a space around the arranged die components in the array with a reflective material to surround the singulated die components, and cutting 254 through the reflective material around the die components to singulate the die components to provide a LED device comprising a die component surrounded by a wall of reflective material. In some embodiments, the method of FIG. 2B can comprise the use of a vacuum chamber and/or gravitational weight instead of and/or in addition to a flat mold or Towa mold.

In some embodiments, the method of FIG. 2B can further comprise curing the reflective material prior to cutting through the reflective material. In the method of FIG. 2B, in the resulting LED device the reflective wall is disposed around an outside edge of the submount.

Figure 3:
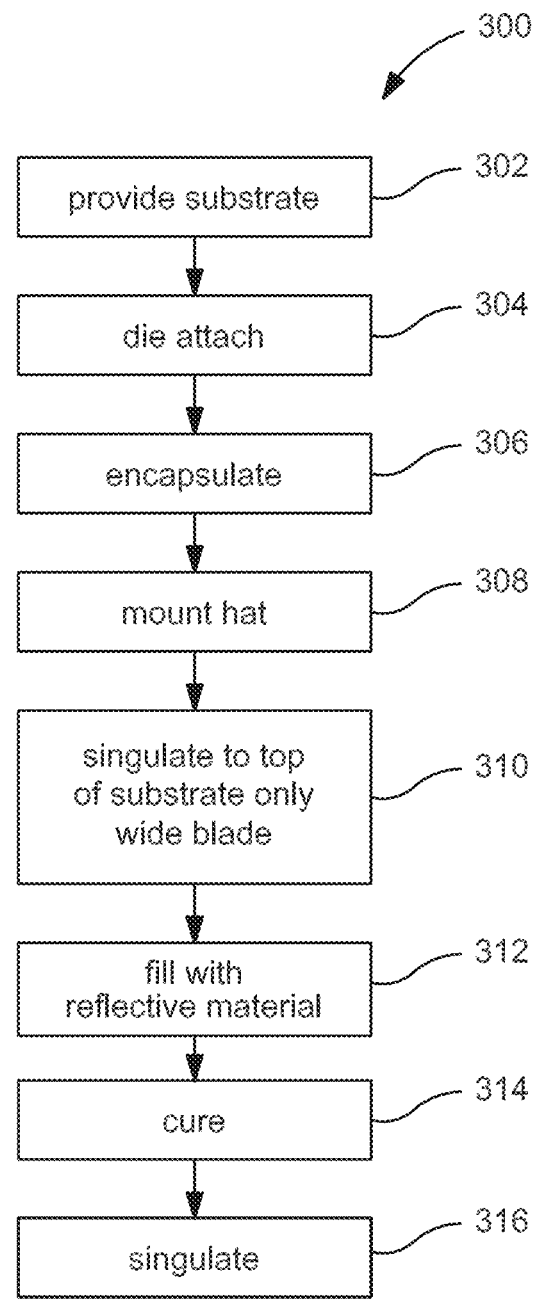
FIG. 3 is a flow diagram of an example method for fabricating a LED component.

FIG. 3 illustrates another method for making a LED device as disclosed herein, using, in some embodiments, some or all of the method steps illustrated therein. In some embodiments, such a method, generally designated 300, can comprise providing a substrate 302, attaching a die 304 to the substrate, applying an encapsulant 306 on an upper surface of the die and/or substrate, singulating the die attached to the substrate by a first cutting 310 through the encapsulant up to the substrate to form a channel separating die components along the substrate, applying a reflective (or white wall) material 312 to surround the singulated die components, and cutting through the white wall material and the substrate by a second cutting 316 to singulate the die components to provide a LED device surrounded by white wall material. In some embodiments, the method 300 of FIG. 3 can comprise providing a substrate 302, attaching a die 304 to the substrate, applying an encapsulant 306 on an upper surface of the die and/or substrate, mounting a light altering material such as a phos hat 308 on the die, singulating the die attached to the substrate by a first cutting 310 through the encapsulant up to the substrate to form a channel separating die components along the substrate, applying a reflective (or white wall) material 312 to surround the singulated die components, curing the reflective material 314, and cutting through the white wall material and the substrate by a second cutting 316 to singulate the die components to provide a LED device surrounded by white wall material. In the method of FIG. 3, the substrate can comprise a ceramic substrate, wherein the ceramic substrate can be about 3.5 mm by 3.5 mm.

In the methods disclosed herein, including, for example, those described above and illustrated in FIGS. 2A, 2B, and 3, the encapsulant can comprise, for example, an epoxy-based or silicone-based curable resin or other polymeric matrix, arranged to cover one or more solid state light emitters, and, in some embodiments, can comprise phosphorus or some other lumipohor as discussed herein. Moreover, in the methods disclosed herein, including, for example, those described above and illustrated in FIGS. 2A, 2B, and 3, the reflective material can comprise $TiO_2$ (in some embodiments, referred to as white paint or white wall). In some embodiments, the reflective material can comprise $TiO_2$ and silicone, wherein the ratio of $TiO_2$:silicone in the reflective wall is about 1:1, or can range between and including about 1:1 and about 3:1.

In some embodiments, the methods disclosed herein, including, for example, those described above and illustrated in FIGS. 2A, 2B, and 3, can result in LED devices wherein the reflective wall is disposed around an outside edge of the submount/substrate, or is disposed on the submount/substrate such that at least a portion of or all of the outer vertical surface of the reflective wall is substantially coplanar with at least a portion of or all of the outer edge of the submount/substrate (discussed further herein). In some embodiments, the wall of reflective material has a thickness of about 50 μm to about 400 μm. In some embodiments, the reflective wall has a thickness of about 250 μm and a ratio of $TiO_2$:silicone of about 1:1, wherein the reflective wall blocks substantially all light emitted from the LED and directed toward the reflective wall. In some embodiments, a LED device from the methods disclosed herein can have a beam angle of light output from the LED device that is substantially reduced as compared to a LED device without the reflective wall. By way of example, and not limitation, the beam angle can have a light output from the LED device of about 115° or less.

Figure 4A:
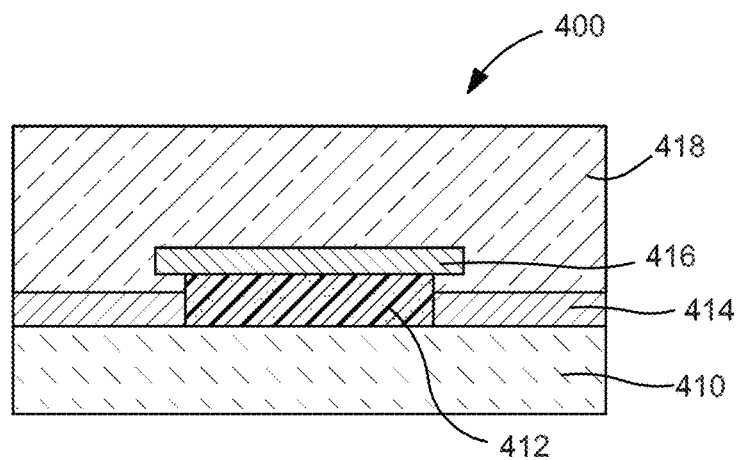
FIGS. 4A through 4C are cross-sectional views of LED components and devices.
Figure 4B:
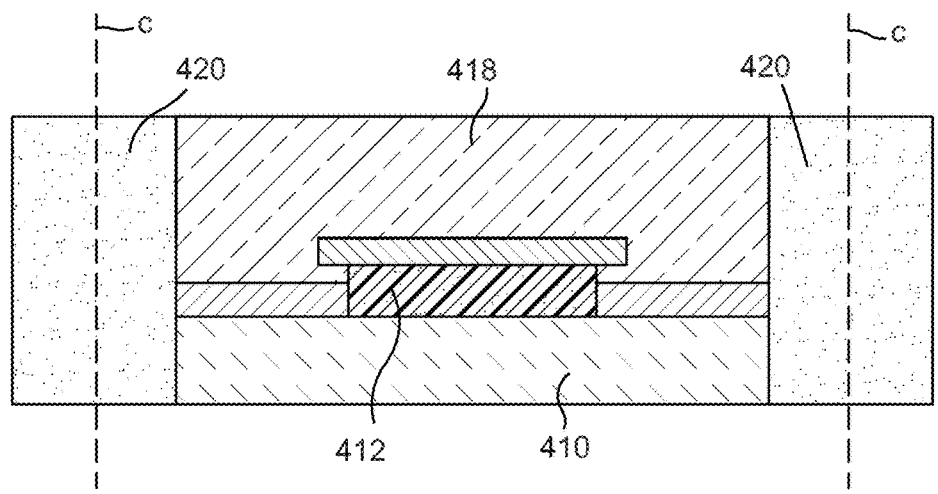
Figure 4C:
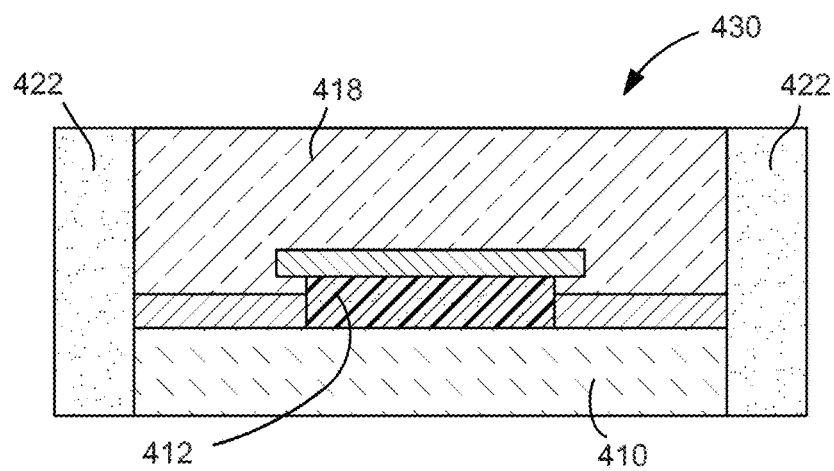

Turning now to FIGS. 4A, 4B, and 4C, these cross-sectional views of LED devices illustrate stages of the production of LED devices with a reflective or white wall as produced by the methods disclosed herein. FIGS. 4A and 4B illustrate LED device components during the production of the exemplary LED device of FIG. 4C, as produced using a method such as shown in FIG. 2A and described hereinabove. LED component, generally designated 400, comprises a substrate 410, e.g., a ceramic substrate, upon which a die 412 is mounted. In some embodiments, and as shown, for example, in FIG. 4A, LED component 400 can further comprise a die attachment material 414, a phos hat 416 and encapsulant 418.

Based on the methods disclosed herein, including, for example, those illustrated in FIG. 2A and discussed above, a reflective material 420 can be added to LED component 400, and particularly around the edges and/or along the sides of LED component 400. In some embodiments, this can be achieved by using a release material, such as thermal tape, to secure one or more LED components during application of a reflective materials, such as is, for example, disclosed in FIG. 2A. In some embodiments, a plurality of LED components in a series or array can be simultaneously surrounded or flooded with reflective material 420, and then subsequently singulated with a cut C to produce LED device, generally designated 430, shown in FIG. 4C. Upon singulation with cut C or removal of excess reflective material 420, an LED device 430 with a surrounding reflective or white wall 422 is provided. The LED components and resulting LED device illustrated in FIGS. 4A-4C can, in some embodiments, yield a LED device similar to that depicted in FIGS. 1A, 1B, and/or 1D, wherein a white wall 422 completely surrounds the outer periphery of the LED component 430 and up to and at least all or a portion of which is substantially coplanar with at least a portion of or all of the upper surface of the LED component 430.

Turning now to FIGS. 5A, 5B, and 5C, these cross-sectional views of LED devices illustrate stages of the production of LED devices with a reflective or white wall, as produced by the methods disclosed herein. FIGS. 5A and 5B illustrate LED device components during the production of an exemplary LED device of FIG. 5C, as produced using a method such as shown in FIG. 2B, and described hereinabove. LED component, generally designated 450, comprises a substrate 452, e.g., a ceramic substrate, upon which a plurality of die 454 are mounted or attached. In some embodiments, and as shown, for example, in FIG. 5A, LED component 450 can further comprise an encapsulant 456, such as described herein in further detail.

Based on the methods disclosed herein, including, for example, that illustrated in FIG. 2B and discussed above, the die 454 attached to the substrate 452 can be singulated by cutting C to form separate die components. Then, as shown in FIG. 5B, a reflective material 458 can be added or applied to the separate die components, particularly around the edges and/or along the sides of the singulated die components. In some embodiments, this can be achieved by using a release material, such as thermal tape, and/or a molding technique, e.g., flat molding. In some embodiments, a plurality of LED components in a series or array can be simultaneously surrounded or flooded with reflective material 458. Upon curing of reflective material 458, a second cut C through reflective material 458 provides for the singulation of the die components to provide LED devices, generally designated 460, surrounded by a wall of reflective material 462, i.e., a white wall. The LED components and resulting LED device illustrated in FIGS. 5A-5C can, in some embodiments, yield a LED device similar to that depicted in FIGS. 1A, 1B, and/or 1D, wherein a white wall completely surrounds the outer periphery of the LED component, up to and at least a portion of or all of which is substantially coplanar with at least a portion of or all of the upper surface of the LED component.

Figure 6A:
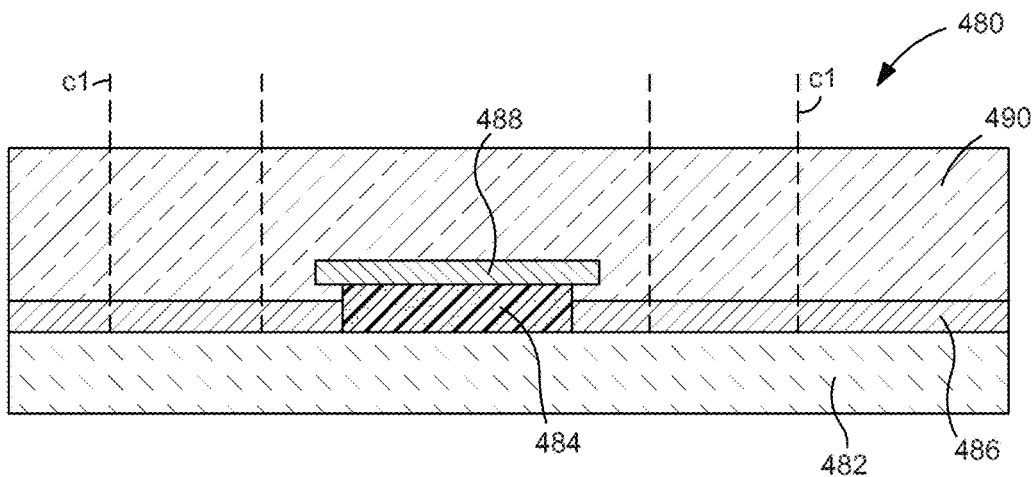
FIGS. 6A through 6D are cross-sectional views of LED components and devices.
Figure 6B:
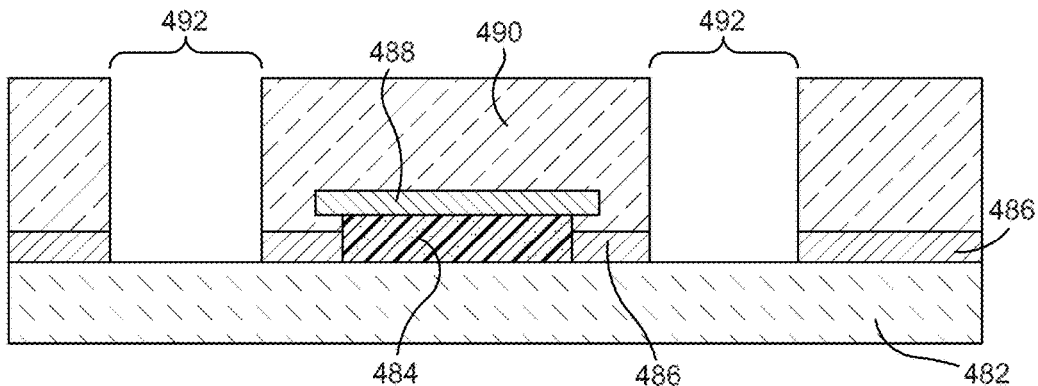
Figure 6C:
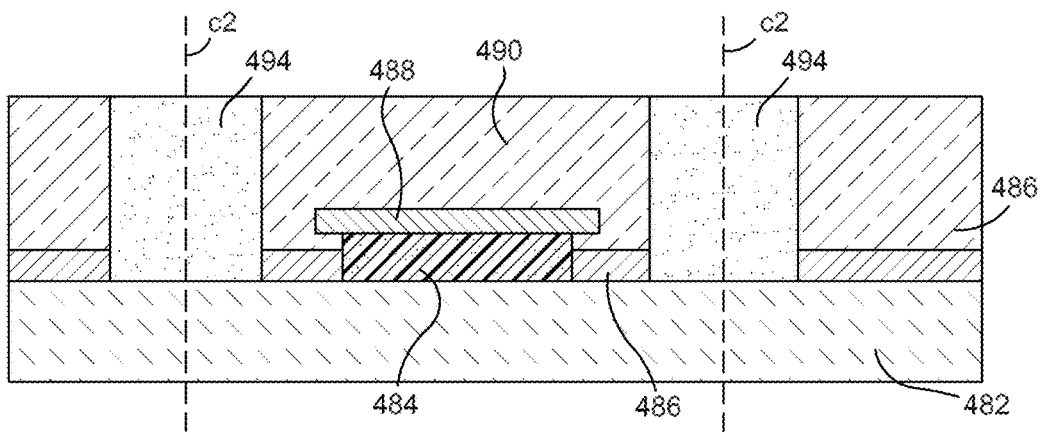

Turning now to FIGS. 6A, 6B, 6C, and 6D, these cross-sectional views of LED devices illustrate stages of the production of LED devices with a reflective or white wall as produced by the methods disclosed herein. FIGS. 6A, 6B, and 6C illustrate LED device components during the production of an exemplary LED device of FIG. 6D, as produced using a method such as shown in FIG. 3 and described hereinabove. LED component, generally designated 480, comprises a substrate 482, e.g., a ceramic substrate, upon which a die 484 is mounted. In some embodiments, and as shown, for example, in FIG. 6A, LED component 480 can further comprise a die attachment material 486, a phos hat 488 and encapsulant 490.

Figure 6D:
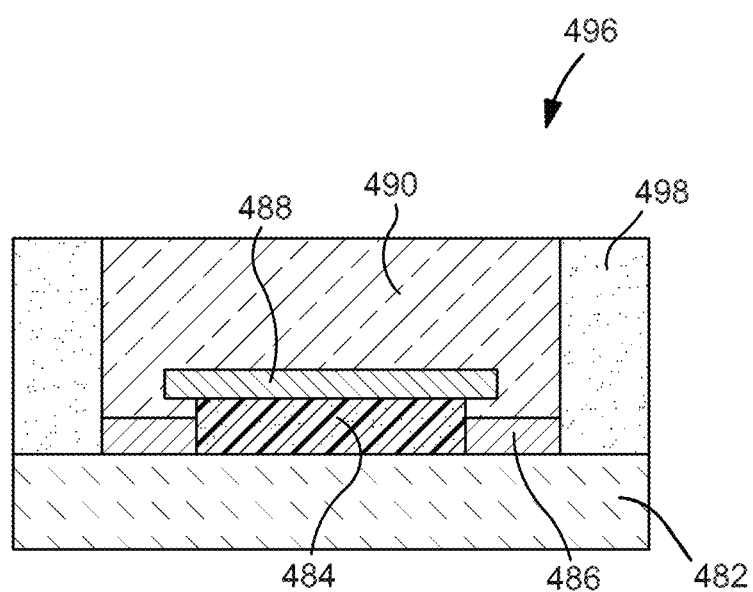

Based on the methods disclosed herein, including, for example, that illustrated in FIG. 3 and discussed above, a reflective material 494 can be added to LED component 480. For example, and as illustrated in FIGS. 6A and 6B, a first cut C1 can be made through encapsulant 490, and/or die attachment material 486, and up to substrate 482 to form a channel 492, separating die components 484 along the substrate 482. Then, within channel 492, a reflective material 494 can be added or applied to fill or substantially fill channel 492. After curing reflective material 494, a second cut C2, as shown in FIG. 6C, can be made by cutting through reflective material 494, i.e., the white wall material, and substrate 482 to singulate the die components to provide a LED device, generally designated 496, surrounded by white wall material, as shown in FIG. 6D. In some embodiments, a plurality of LED components in a series or array can be cut to form channels 492, surrounded or flooded with reflective material 494, and then subsequently singulated with a cut C2 to produce LED devices 496 in FIG. 6D. The LED components and resulting LED device illustrated in FIGS. 6A-6D can, in some embodiments, yield a LED device similar to that depicted in FIGS. 1A, 1B, and/or 1C, wherein a white wall completely surrounds the outer periphery of the LED component, built upon the substrate, up to and at least a portion of or all of which is substantially coplanar with at least a portion of or all of the upper surface of the LED component.

Figure 7A:
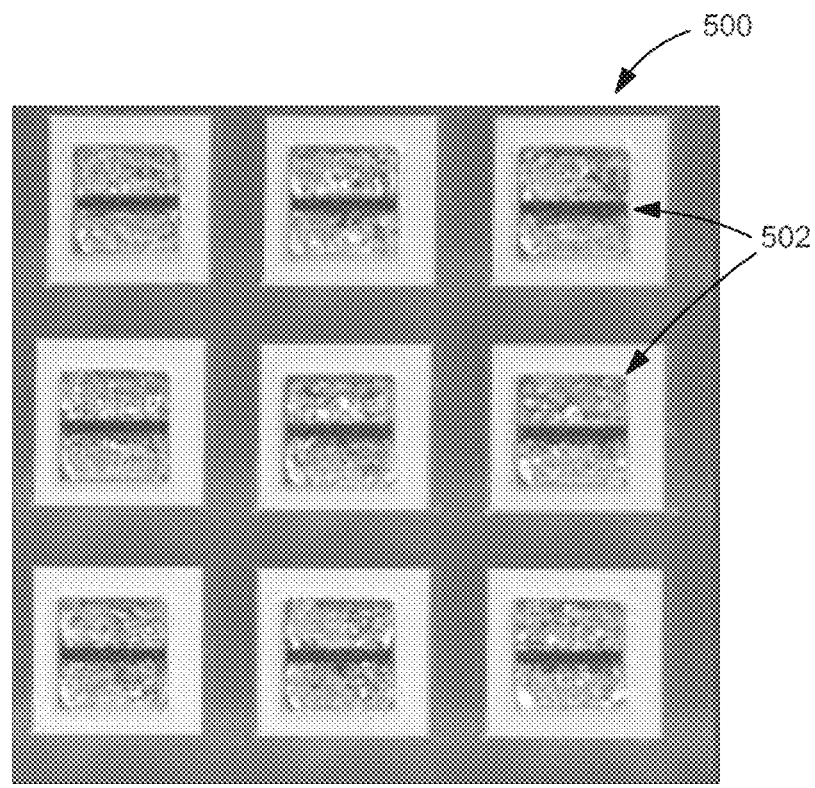
FIGS. 7A and 7B are images of LED components.
Figure 7B:
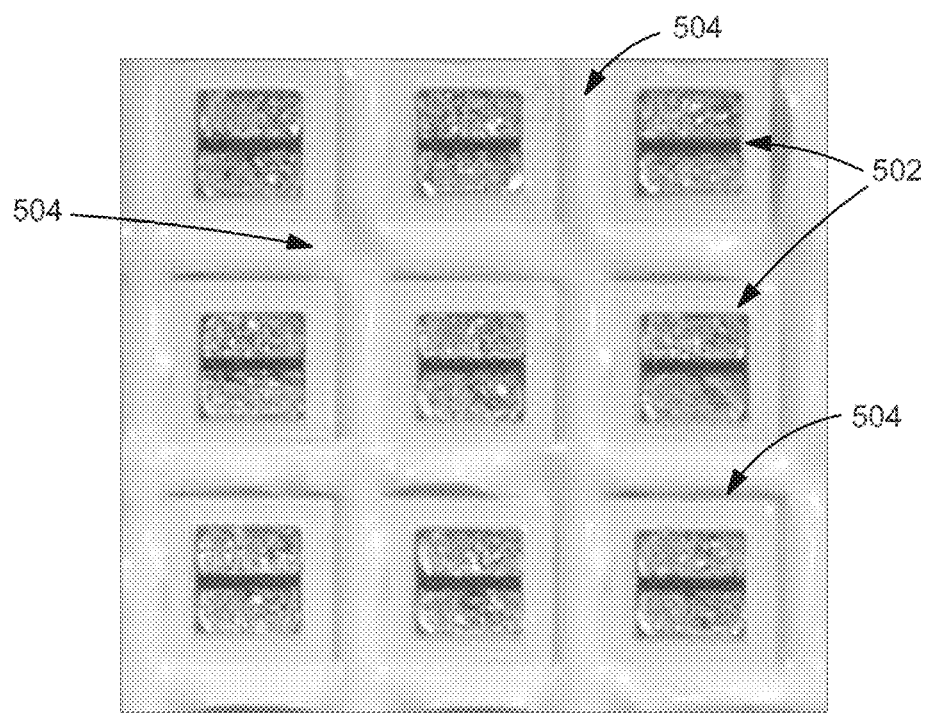

In some embodiments, the disclosed methods and resulting LED devices incorporating a whitewall around a LED is applicable to various types of LEDs, including, for example, chip level packaged, as well as wafer level packaged (WLP), LEDs. Thus, in some embodiments, WLP LEDs can be used to create LED devices with a whitewall, as disclosed herein, to improve light emission characteristics and performance. FIGS. 7A and 7B, for example, show WLP LEDs, generally designated 502, arranged in a matrix, generally designated 500, of WLP LEDs, with a reflective material, generally designated 504, i.e., a whitewall, applied in the spaces between each WLP LED 502 in the matrix 500. In some embodiments, multiple passes can be used to apply the reflective material 504, or white paint, such that it substantially or completely fills the gaps in the matrix 500 of WLP LEDs 502. After curing, the WLP LEDs 502 in the matrix can be singulated, such as, for example, by cutting, as disclosed herein, to form individual or groups of whitewall WLP LEDs, or LED components (see, e.g., FIGS. 9A and 9B).

Figure 8A:
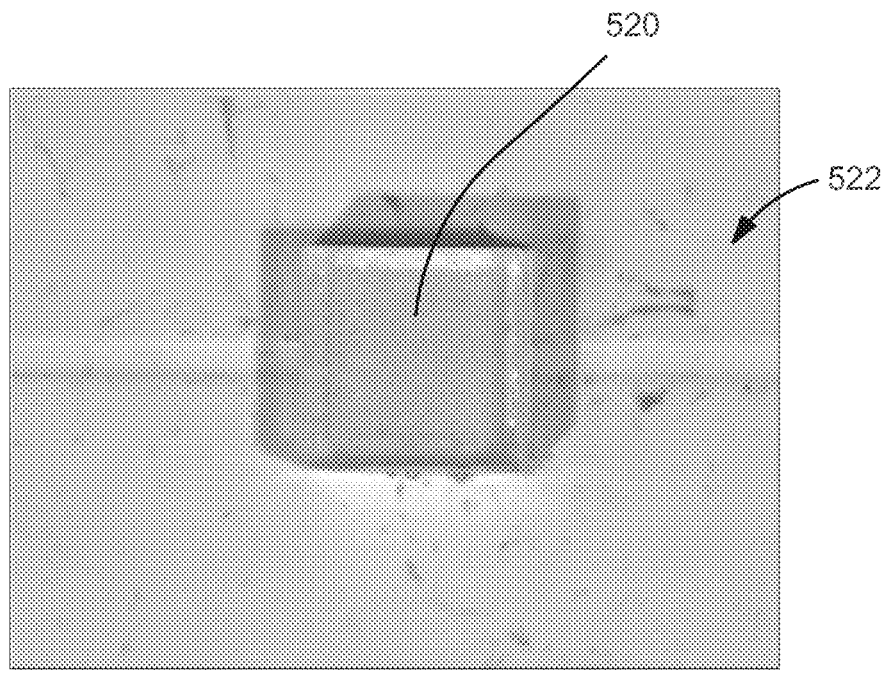
FIGS. 8A through 8C depict LEDs without a reflective material, with FIGS. 8A and 8B being images of LEDs and FIG. 8C being a cross-sectional schematic of a LED.
Figure 8B:
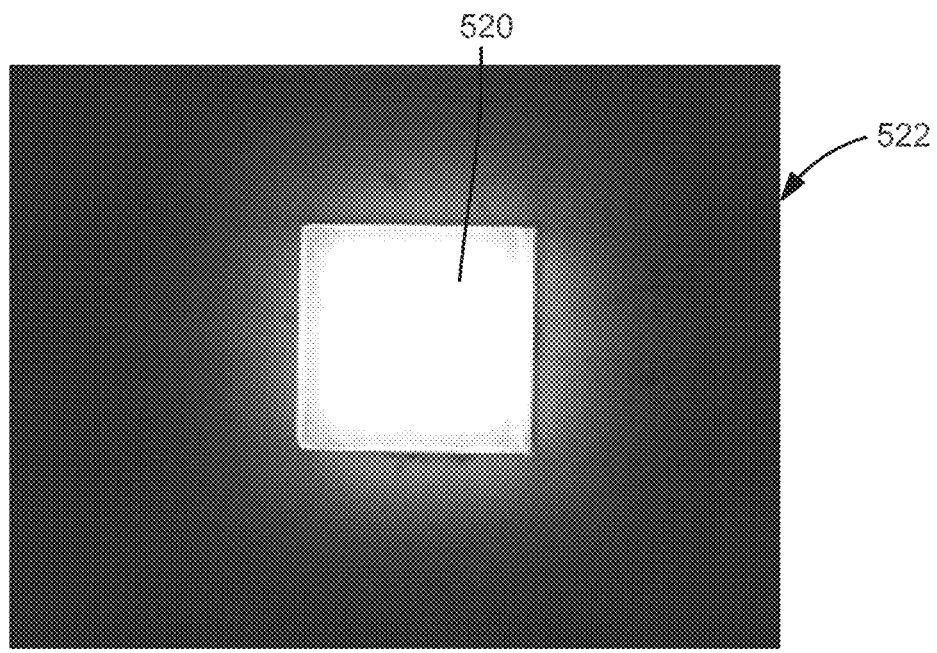
Figure 8C:
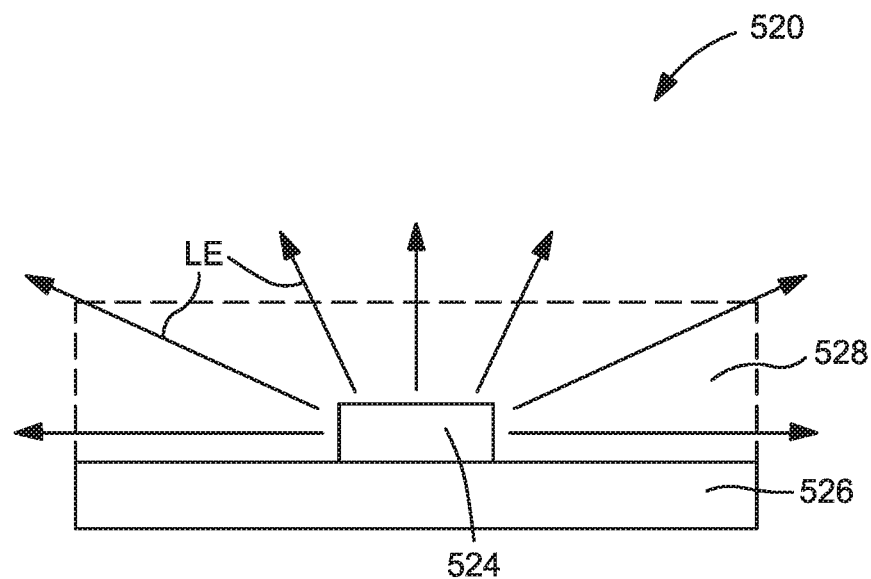

FIGS. 8A through 8C and 9A through 9C illustrate a comparison of WLP LEDs, without and with a whitewall, respectively. More particularly, FIGS. 8A through 8C show WLP LEDs without a reflective wall, or whitewall. FIG. 8A is an image of a WLP LED 520 resting on a surface, generally designated 522, e.g., a starboard, in a powered off state. FIG. 8B is an image of a WLP LED 520 resting on a surface 522 and in a powered on state during a lighting test. As shown in FIG. 8B, significant light is emitted from the sides of the WLP LED 520, reflecting off surface 522. As illustrated in FIG. 8C, such an WLP LED 520 comprises a singulated die 524 positioned on a package wafer 526 and an encapsulant 528 surrounding the singulated die 524, FIG. 8C further shows that light emission LE from a singulated WLP LED without the disclosed light reflecting wall (see, e.g., FIG. 9C) is emitted in multiple directions (e.g., about 180 degrees), including substantially horizontal and out of the sides of the device.

Figure 9C:
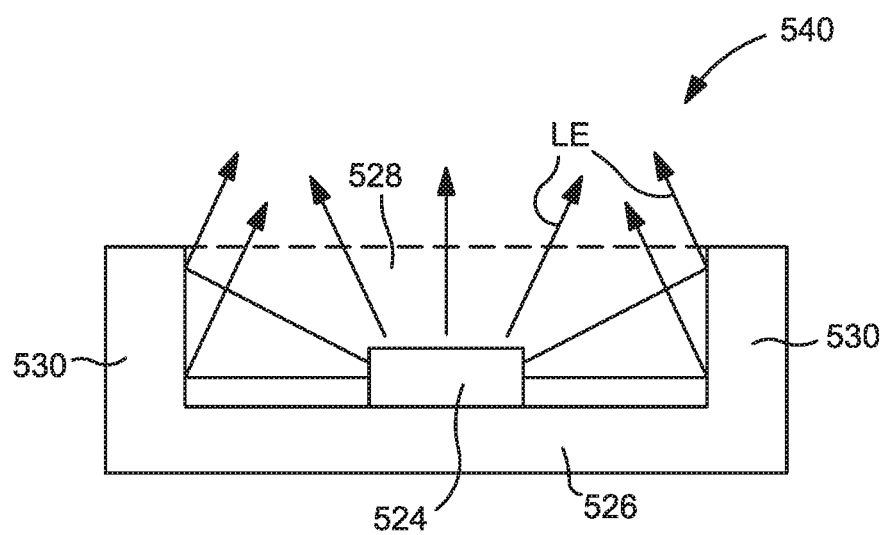
FIGS. 9A through 9C depict LEDs with a reflective material, with FIGS. 9A and 9B being images of LEDs and FIG. 9C being a cross-sectional schematic of a LED.
Figure 9A:
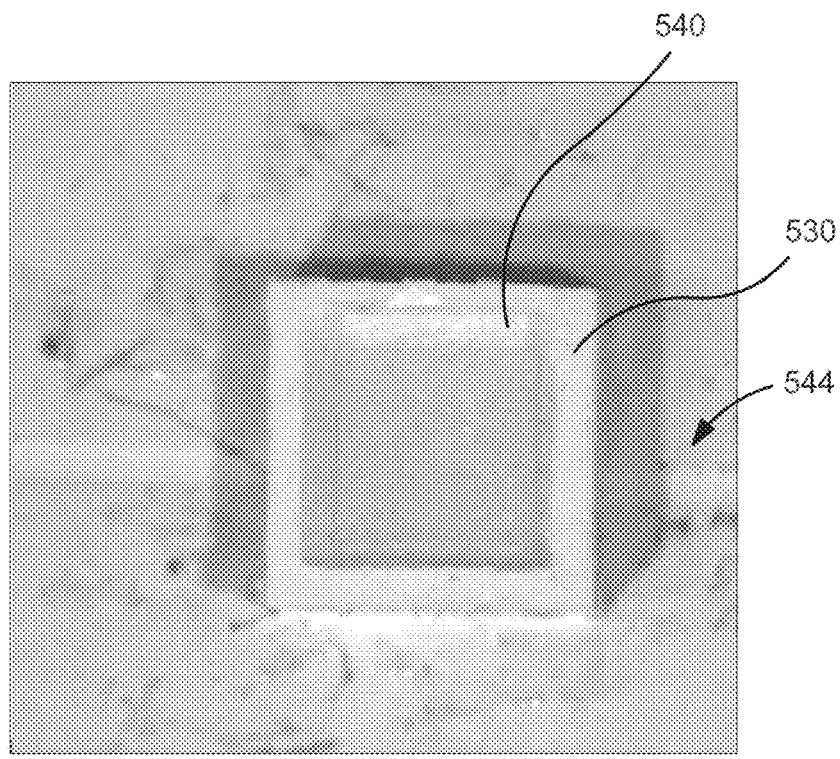
Figure 9B:
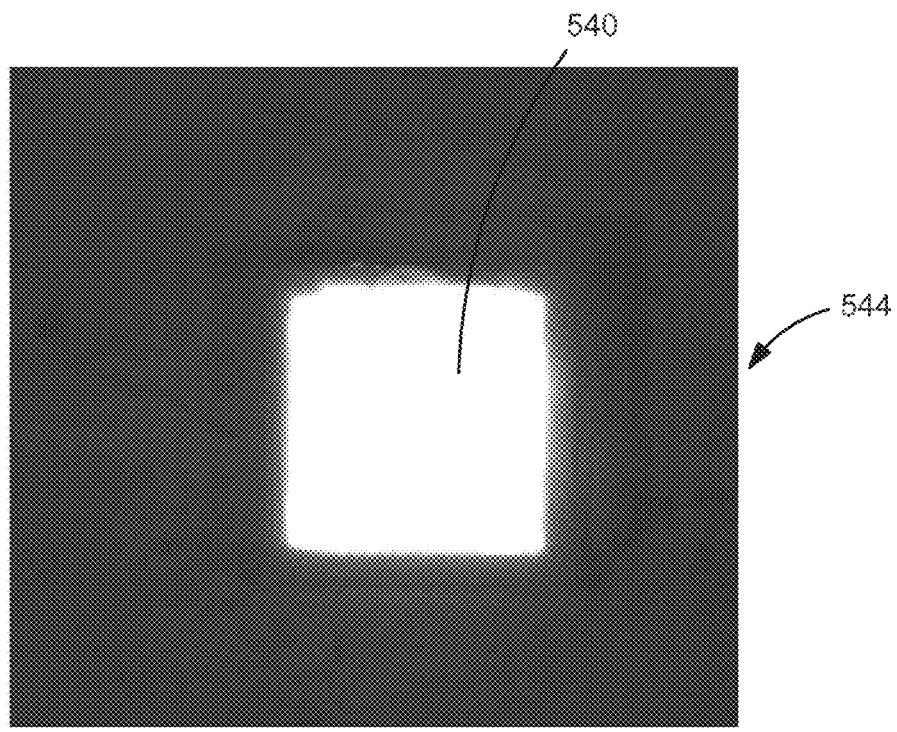

Conversely, FIGS. 9A through 9C show WLP LEDs with a reflective wall 530, or whitewall. FIG. 9A is an image of a WLP LED, generally designated 540 resting on a surface 544, e.g., a starboard, in a powered off state. FIG. 9B is an image of a WLP LED 540 resting on a surface 544 and in a powered on state during a lighting test. As shown in FIG. 9B, minimal light is reflecting off surface 544, indicating that light emitted from the sides of the WLP LED 540 has been minimized, particularly as compared to LED 520 in FIG. 8B with no whitewall. FIG. 9C, shows a LED device 540, comprising a singulated die 524 positioned on a package wafer 526, an encapsulant 528 surrounding the singulated die 524, and a reflective wall 530 surrounding the encapsulant 528 that surrounds the singulated die 524, wherein at least a portion of or all of an upper surface of the reflective wall 530 is substantially coplanar with at least a portion of or all of an upper surface of the encapsulant 528. The composition and dimensions of the reflective wall 530 in this embodiment can, in some embodiments, be similar to that disclosed herein for other LED devices and components. As illustrated in FIG. 9C, light emission LE from a singulated WLP LED with the disclosed light reflecting wall 530 is emitted in a substantially vertical direction by virtue of the reflective wall acting to optimize a beam angle.

Figure 10A:
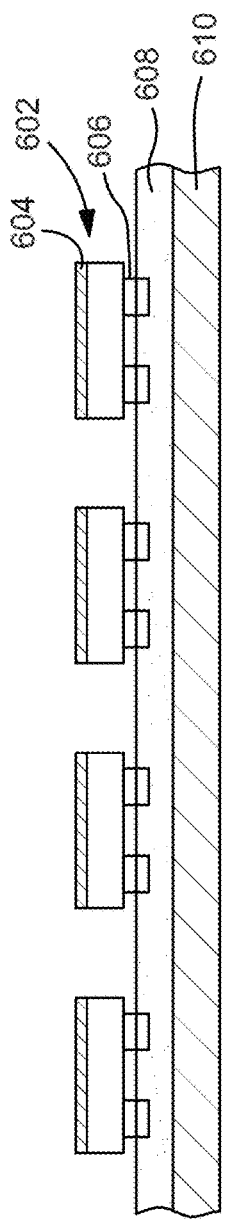
FIGS. 10A through 10D are cross-sectional views of LED components and devices.
Figure 10B:
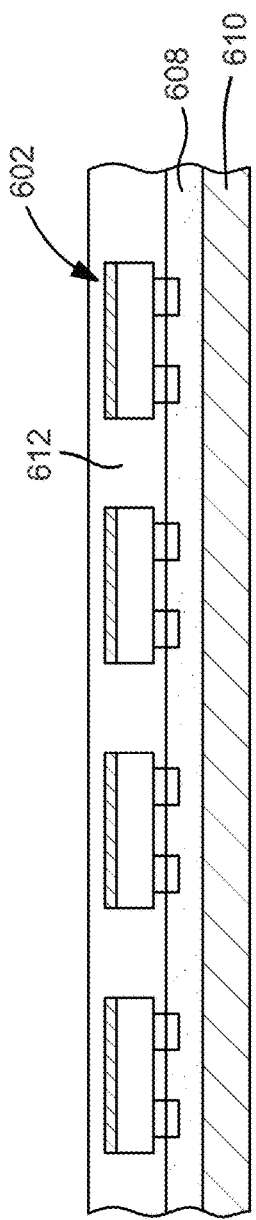
Figure 10C:
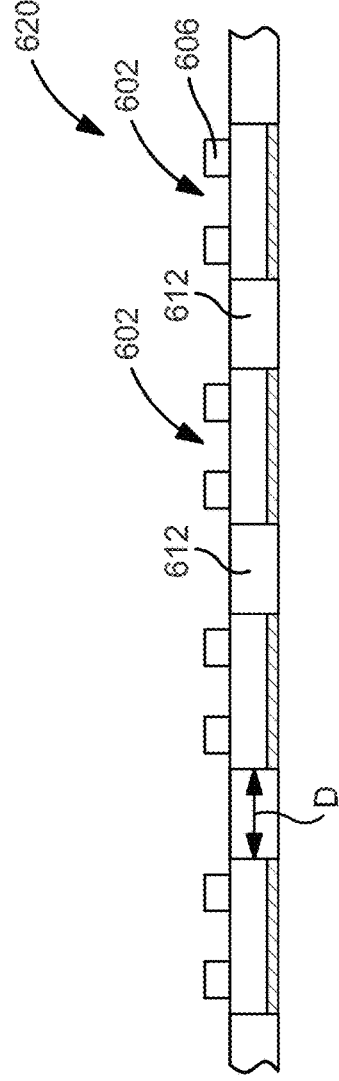
Figure 10D:
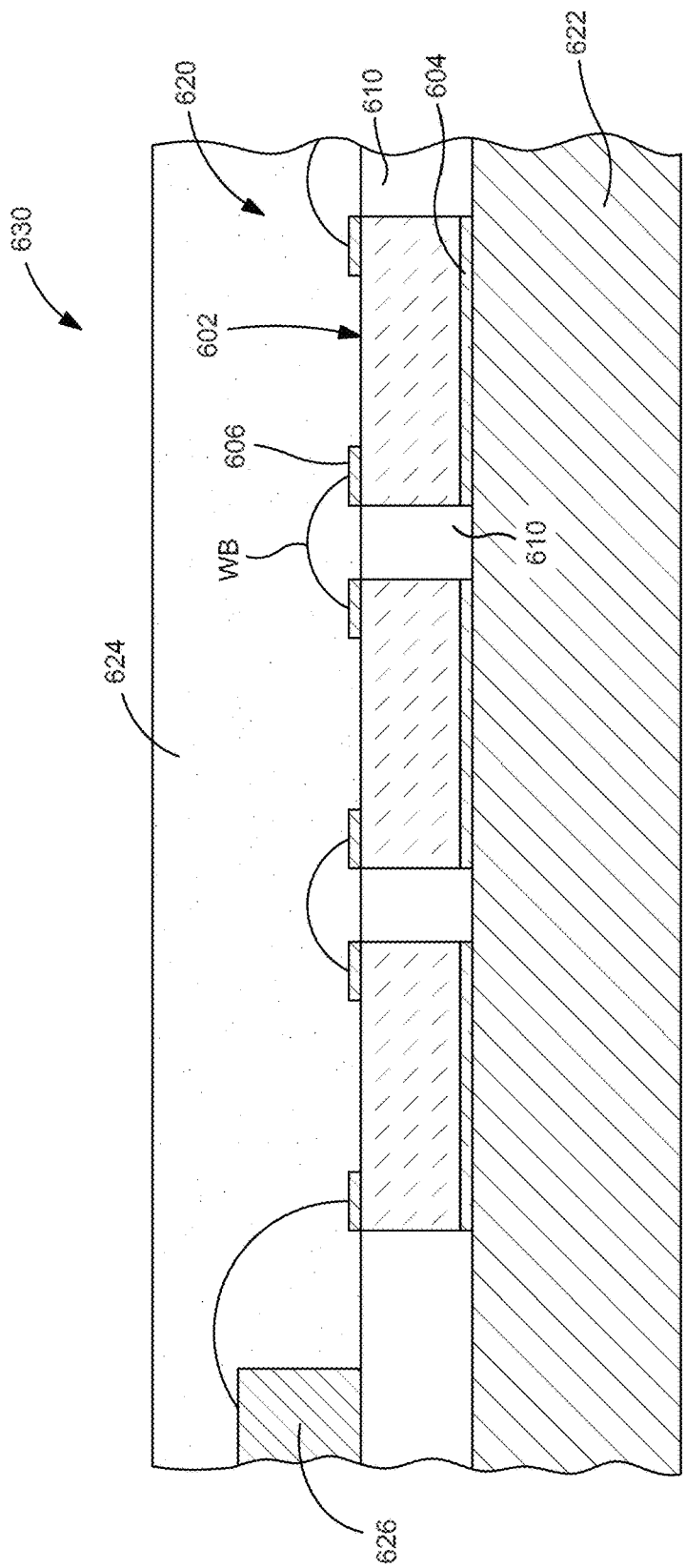

In some embodiments, LED components and/or LED devices can be assembled or made using a series of steps, as illustrated in FIGS. 10A-10C, and incorporated into a LED device, such as LED device 630 shown in FIG. 10D. A plurality of LED chips, generally designated 602, can be provided, wherein LED chips 602 can comprise an upper surface with one or more bond pads 606, a lower surface, and one or more sides. LED chips 602 include a diode 604. LED chips 602 can be applied to a thermal release tape 608, or other releasable material, in some embodiments, within a mold, as shown in FIG. 10A. The LED chips 602 can be applied to thermal release tape 608 such that LED chips 602 are applied with the upper surface or bond pads 606 facing down, i.e., pressed into release tape 608. In some aspects, release tape 608 can be provided on a substrate 610. Next, as shown in FIG. 10B, LED chips 602 on thermal release tape 608 can be flooded or otherwise surrounded on one or more sides with reflective material 612. In some aspects, a mold, e.g., a press mold or vacuum mold, can be used for applying reflective material 612. In some embodiments, flooding the LED chips 602 with a reflective material 612 to surround the one or more sides of the LED chips 602 with the reflective material 612 can comprise applying the reflective material 612 at least up to the lower surface of the LED chips 602 that is facing up opposite the release tape 608. Reflective material 612 surrounding LED chips 602 can be cured to form a puck, generally designated 620, of reflective material 612 with LED chips 602 embedded therein. Next, puck 620 can be removed from thermal release tape 608, and if needed, in some embodiments, excess reflective material 612 can be removed from, e.g., by sanding, an upper surface of LED chips 602 to expose one or more bond pads 606, as shown in FIG. 10C. In FIG. 10C puck 620 comprises LED chips 602 separated by reflective material 612 at a distance D, such that each LED 602, while being incorporated in to the same puck 620, is effectively isolated so that performance and light emissions thereof can be enhanced. In some aspects, puck 620 can be flipped over and applied to a substrate 622 to form a LED device 630, as shown in FIG. 10D.

In some embodiments, including in the steps illustrated in FIGS. 10A-10C, a flat mold, Towa mold, vacuum chamber, and/or gravitational weight can be used in the molding portion. If needed, in some embodiments, excess reflective material 612 can be removed from an upper surface of LED chips 602 to expose one or more bond pads 606, as shown in FIG. 10C, by using any abrasive material such as coarse sand paper followed by finer grit sand paper or emery paper for polishing, and/or by using solvent or a hot-air-gun to "flash-melt" excess material.

In FIG. 10D, LED device, generally designated 630, comprises a substrate 622 with puck 620 applied thereto to provide a plurality of spaced apart LED chips 602 surrounded by reflective material 610. The LED chips 602 can be electrically connected on the LED device 630 via wire bonds WB, and, in some aspects, to one or more conductive traces 626 or other suitable power source. In some embodiments, an encapsulant 624, as described herein, can be applied to LED device 630. In FIG. 10D LED chips 602 in puck 620 can be polished prior to application to substrate 622 to assure proper metal exposure on the die.

Substrate 622 of LED device 630 can comprise any suitable substrate, including, for example, a ceramic substrate or a metal substrate. Reflective material 610 comprises $TiO_2$, or, in some embodiments, $TiO_2$ and silicone, wherein the ratio of $TiO_2$:silicone ranges between and including about 1:1 and about 3:1.

Figure 11A:
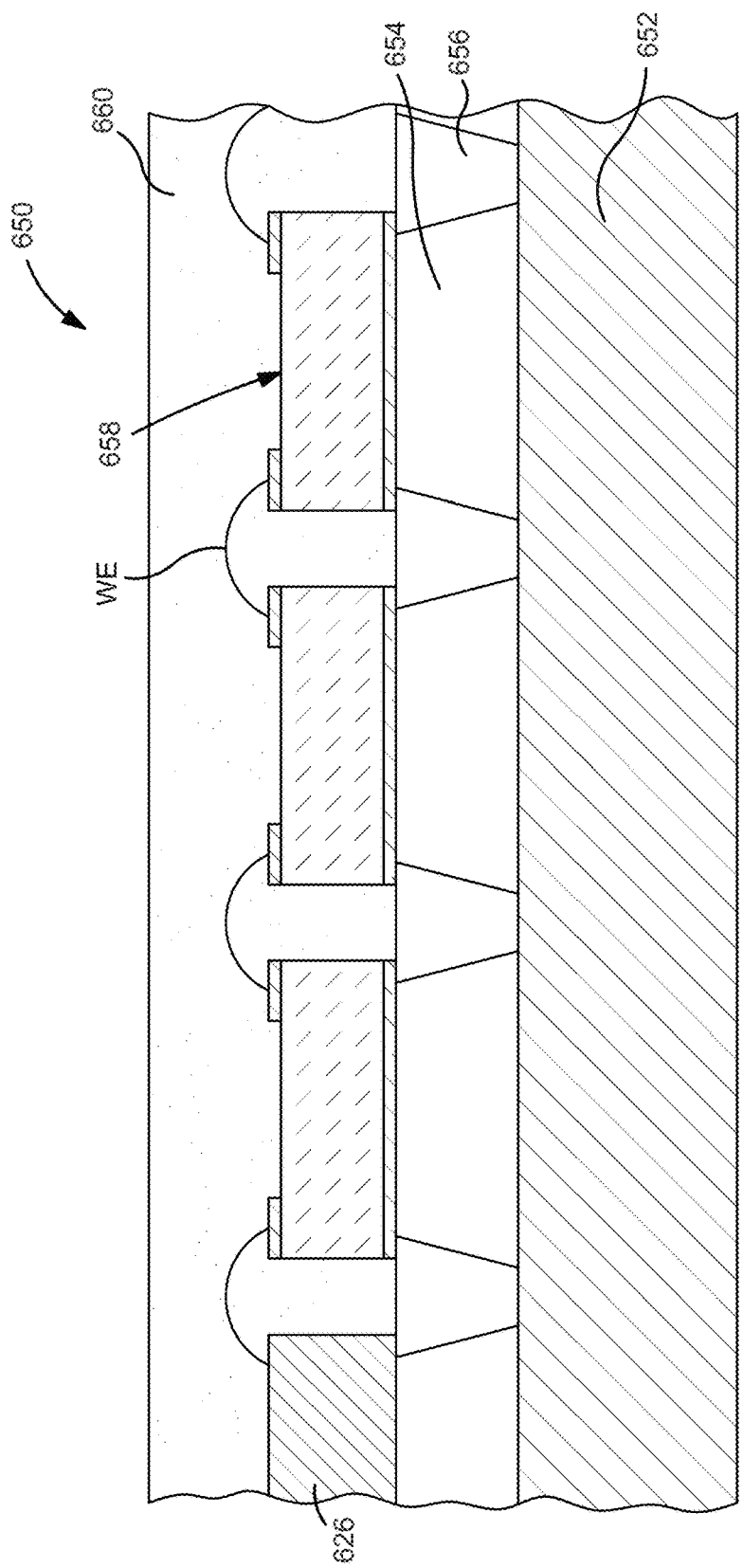

FIGS. 11A and 11B are cross-sectional views of additional LED devices as disclosed herein, wherein a reflective material provides enhanced performance and/or emission profiles. In FIG. 11A, LED device, generally designated 650, comprises a substrate 652 with pedestals 654. Substrate 652 can, in some embodiments. comprise a stamped aluminum material with pedestals 654 configured for attaching die or LEDs thereto. Pedestals 654 can comprise the same or a different material than substrate 652, including, for example, ceramic, metal, or aluminum. On an upper surface of pedestals 654, one or more LED chips 658, or dies, can be applied, wherein a plurality of LED chips, generally designated 658, can be electrically connected via wire bonds WB. In some embodiments, a reflective material 656 can be provided between pedestals 654, and can, in some embodiments, the space between pedestals 654 can be filled or substantially filled such that the reflective material 656 is approximately the same height at pedestals 654. Where reflective material 656 is applied between pedestals 654 prior to attachment of LED chips 658 the upper surfaces of pedestals 654 can be polished to remove any excess reflective material 656 and to provide for proper attachment of LED chips 658. In such a configuration, any light reflecting from LED chips 658 and angled downward toward pedestals 654 can be reflected back to improve light output and emission angles from LED device 650. In some aspects, LED chips 658 can comprise a sapphire die with a mirrored backside.

Similarly, in FIG. 11B LED device, generally designated 670, comprises a substrate 652 with pedestals 654. Pedestals 654 can comprise the same or a different material than substrate 652, including, for example, ceramic or metal. On an upper surface of pedestals 654, one or more LED chips 658, or dies, can be applied, wherein a plurality of LED chips 658 can be electrically connected via wire bonds WB. In some embodiments, a reflective material 656 can be provided between pedestals 654. In contrast to the device in FIG. 11A, the space between pedestals 654, as well as the space between LED chips 658, can be filled or substantially filled such that the reflective material 656 is approximately the same height at LED chips 658. In such a configuration, any light reflecting from one or more sides of LED chips 658 is reflected back and/or out of the top of LED chips 658 to improve light output and emission angles from LED device 670. In some aspects, LED chips 658 can comprise a sapphire die with a mirrored backside.

In some embodiments, to arrive at LED device 670 in FIG. 11B, a substrate 652 with pedestals 654 can be provided, wherein a reflective material 656 is applied in the space between pedestals 654, as in FIG. 11A. Then, a puck 620, as in FIG. 10C can be applied to pedestals 654 such that the LED chips align with the pedestals and the reflective material in the puck aligns with the reflective material between the pedestals. This results in a LED device 670, as depicted in FIG. 11B.

Similar to the above embodiments, reflective material 656 in LED devices 650 and 670 can comprise $TiO_2$, or, in some embodiments, $TiO_2$ and silicone, wherein the ratio of $TiO_2$:silicone ranges between and including about 1:1 and about 3:1.

Figure 12A:
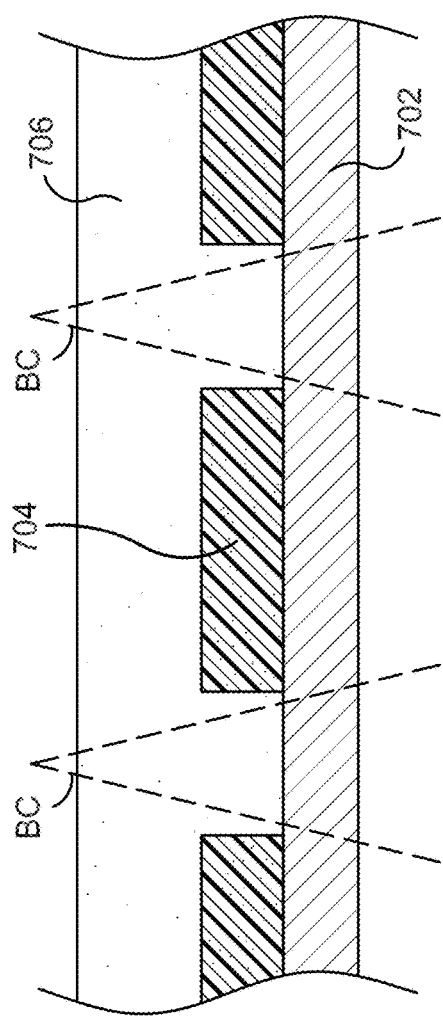
FIGS. 12A and 12B are cross-sectional views of LED components and devices as disclosed herein.
Figure 12B:
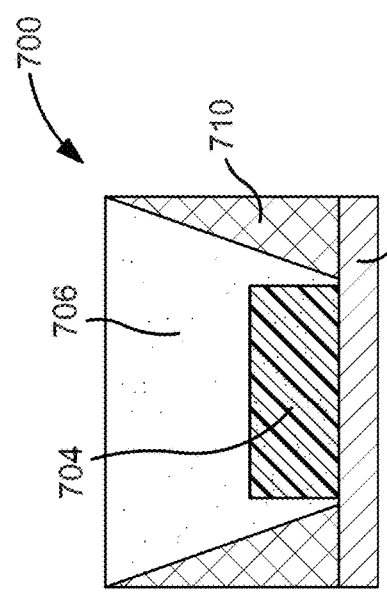

FIGS. 12A and 12B are cross-sectional views of LED components and devices made by a method disclosed herein. LED device, generally designated 700, of FIG. 12B can comprise a die or LED chip 704 on a packaged wafer 702, or a wafer level packaged (WLP) LED, with an encapsulant 706 and beveled or angled white wall 710. To form LED device 700, WLP LEDs can be encapsulated with an encapsulant 706, as disclosed herein. As shown in FIG. 12A, a beveled blade can be used to make a bevel cut BC through packaged wafer 702 (or substrate) and through encapsulant 706 (or glass). In effect, the outer edge of the die on the packaged wafer 702 is shaped by the bevel cut BC from a bottom side of the die on the package wafer to form a bevel edge with an inclined angle. The space left by the bevel cut BC can then be filled with reflective material 710 using any of the methods disclosed herein, including, for example, flat molding and/or use of thermal release tape. The wall of reflective material 710 is applied to the beveled edge to form a wall of reflective material having a thickness at a bottom of the wall greater than at the top thereof, thereby allowing an engineered (e.g., a predetermined and/or desired) amount of light to be transmitted. In some aspects, where all sidewall thicknesses are optically thick, the shaped or beveled edge may be optically brighter than a straight sidewall. In some embodiments, making the beveled angle larger (e.g., greater) will cause the component to be brighter (e.g., output greater light intensity in at least one aspect). In some embodiments, a component that is "optically thick" is a component configured to allow no or little appreciable light to transmit therethrough. For example, an optically thick component or material can be sufficiently thick, or have sufficient scattering properties, to reflect or otherwise preclude light from transmitting through the component or material.

Once reflective material 710 is cured, a straight cut can be made through reflective material 710 in bevel cut BC to singulate the LED components and form LED device 700 with beveled or angled reflective material, i.e., white wall, 710, the result of which is shown in FIG. 12B. By providing an angled white wall 710, as shown in FIG. 12B, light reflection can be enhanced such that emission angles and profiles can be optimized.

Similar to the above embodiments, reflective material 710 in LED device 700 can comprise $TiO_2$, or, in some embodiments, $TiO_2$ and silicone, wherein the ratio of $TiO_2$:silicone ranges between and including about 1:1 and about 3:1.

Figure 13:
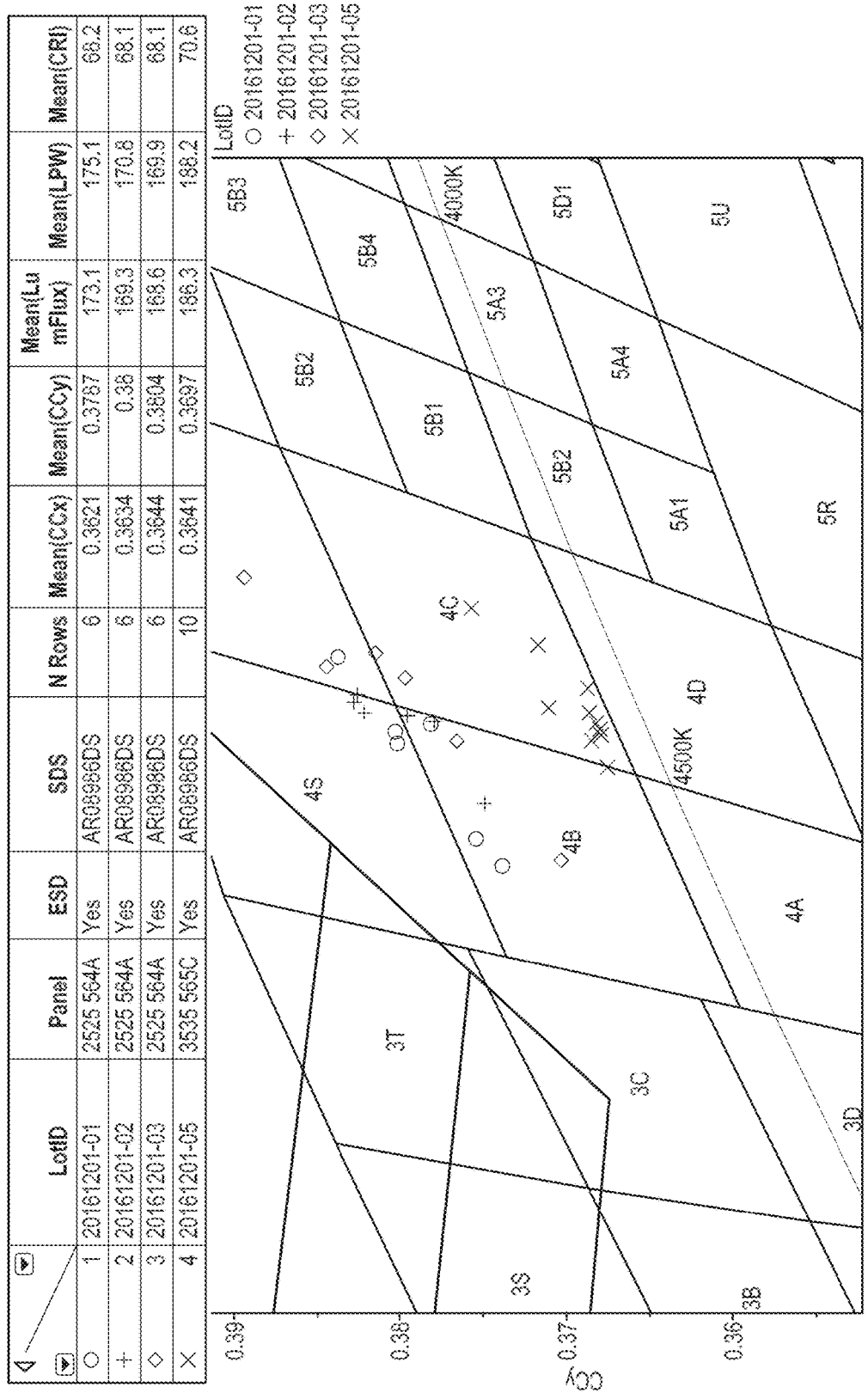
FIG. 13 is a color space diagram confirming the validity of datapoints in FIG. 14.
Figure 14:
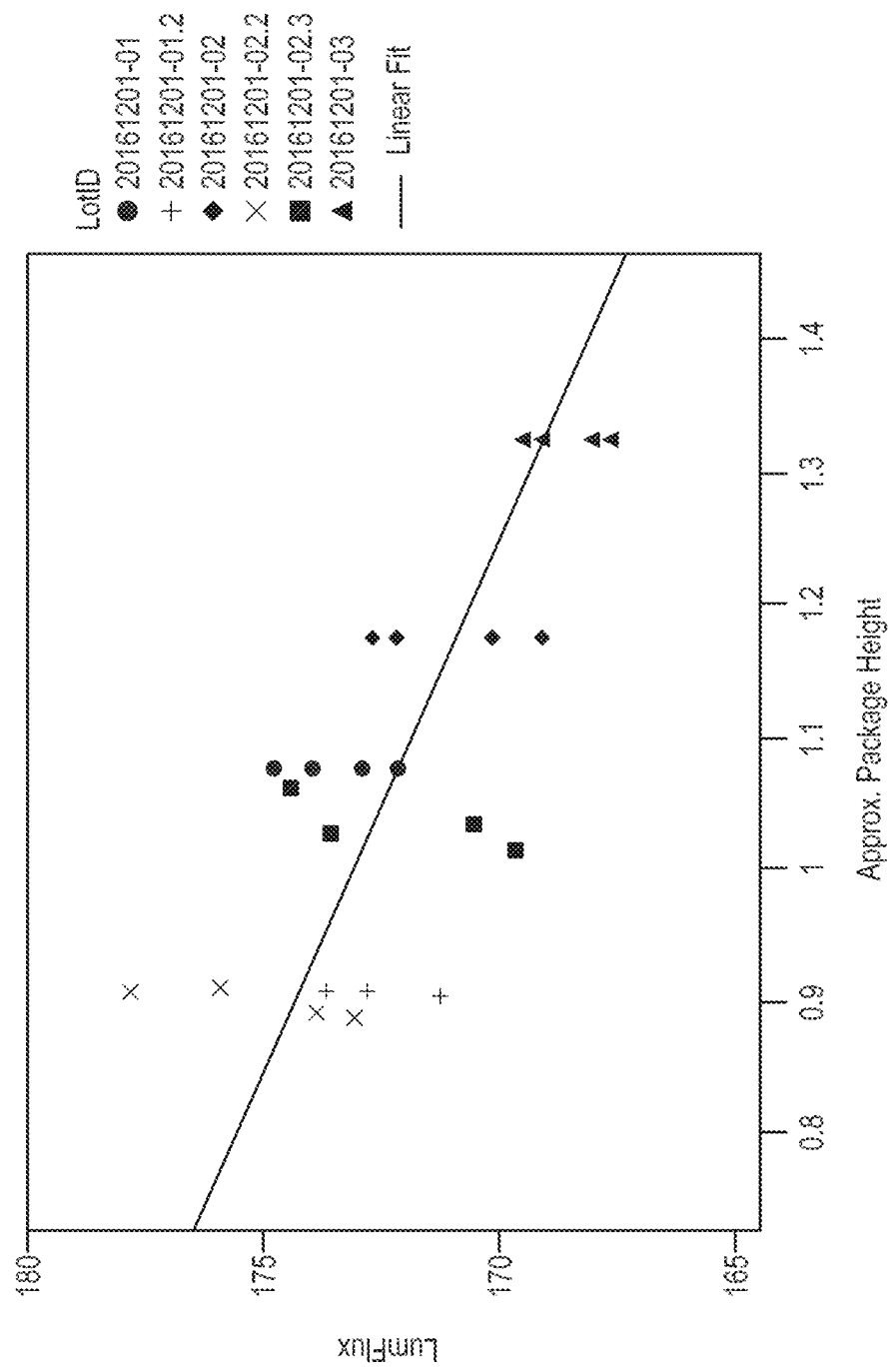
FIG. 14 is a plot of emission output performance data from a LED device illustrating the relationship between package height and brightness.

FIGS. 13 and 14 are graphical depictions of luminal performance. FIG. 13 is a color space diagram demonstrating that the datapoints in FIG. 14 are valid as the color positions are similar. FIG. 14 illustrates the relationship between package height and brightness. There is also a corresponding relationship between brightness and viewing angle since the different package heights have a viewing angle trend of tighter angle with a taller package. As such, while the viewing angle can be tuned, there is a trade-off in lumens, although perhaps not in useful lumens. Viewing angle can in some embodiments be an important consideration in determining optimal luminal output, but it can also a consideration in secondary optics design (e.g., reflector design).

Traces, electrical contacts, leads and contact pads, as described herein, can comprise any suitable electrically conductive material, e.g., Cu, finished with electroless Ag, Ni—Ag, ENIG, ENIPIG, HASL, OSP, or the like. Traces can be applied over one or more surfaces of a substrate via plating (e.g., via electroplating or electroless plating), depositing (e.g., physical, chemical, and/or plasma deposition, CVD, PECVD, etc.), sputtering, or via any other suitable technique. In some aspects, traces can comprise a metal or metal alloy which may contain (in whole or part) copper (Cu), silver (Ag), gold (Au), titanium (Ti), palladium (Pd), aluminum (Al), tin (Sn), combinations thereof, and/or any other suitable conductor.

In some aspects, substrates and/or submounts can comprise a printed circuit board (PCB), a metal core printed circuit board (MCPCB), a flexible printed circuit board, a dielectric laminate (e.g., FR-4 boards as known in the art), a ceramic based substrate, or any other suitable substrate for mounting LEDs and/or LED packages. In some aspects, such substrates can comprise one or more materials arranged to provide desired electrical isolation and high thermal conductivity. For example, at least a portion of such substrates may comprise a dielectric to provide the desired electrical isolation between electrical traces and/or sets of solid state emitters. In some aspects, such substrates can comprise ceramic, such as alumina ($Al_2O_3$), aluminum nitride (AlN), silicon carbide (SiC), silicon, or a plastic, or polymeric material, such as polyimide, polyester, etc. In some aspects, such substrates comprise a flexible circuit board, which can allow the substrate to be formed in a non-planar or curved shape, allowing for directional light emission to be provided, with the solid state emitters also being arranged in a non-planar manner on the non-planar substrate.

In some aspects, LEDs can be horizontally structured, so that the LEDs mounted on a substrate or submount can be electrically connected to traces without the use of wire bonding. For example, each LED can be a horizontally structured device where each electrical contact (e.g., the anode and cathode) can be disposed on a bottom surface of the LED. Die attaching LEDs using any suitable material and/or technique (e.g., solder attachment, preform attachment, flux or no-flux eutectic attachment, silicone epoxy attachment, metal epoxy attachment, thermal compression attachment, bump bonding, and/or combinations thereof)

can directly electrically connect LEDs to electrical traces without requiring wire bonds.

In some aspects, the LEDs in the LED devices and systems disclosed herein can be devices that do not comprise angled or beveled surfaces. For example, such LEDs can be a LED device that comprises coplanar electrical contacts on one side of the LED (bottom side) with the majority of the light emitting or transmitting surface being located on the opposite side (upper side), also know as a "flip-chip" component. LEDs can be bump bonded to traces using bumps of solder (or other appropriate conductive material) and force, energy (e.g., ultrasonic), and/or heat.

In some aspects, LED devices can optionally include diffuse layers for optics, lenses, polarizers, anti-reflective (AR) coating, anti glare, micro lenses, light steering, parallax barrier, lenticular arrays, and so on. As a result, the diffuse reflection of such devices can be 5% or less in the visible part of the spectrum.

In some aspects, and according to the disclosure herein, a light emitting diode (LED) device comprises a submount comprising an upper surface and a bottom surface, an LED disposed on the upper surface of the submount, the LED comprising an upper surface and one or more sides, an encapsulant surrounding the LED, the encapsulant being disposed on the upper surface and one or more sides of the LED, and a reflective wall surrounding the encapsulant that surrounds the LED, wherein at least a portion of an upper surface of the reflective wall is substantially coplanar with at least a portion of an upper surface of the encapsulant. In some aspects, the LED device as described above can include the submount extending beyond the one or more sides of the LED, and a portion of the upper surface of the submount that extends beyond the one or more sides of the LED forms a floor of the LED device. A surface area of the floor of the LED device can be substantially equal to or greater than a surface area of the upper surface of the LED. An outside edge of the reflective wall can be substantially coplanar with an outside edge of the submount. The reflective wall can be disposed around an outside edge of the submount. The encapsulant can comprise an epoxy-based or silicone-based curable resin or other polymeric matrix. The reflective wall can comprise TiO2. The reflective wall can comprise TiO2 and silicone, and a ratio of TiO2:silicone in the reflective wall can be about 1:1. The reflective wall can comprise TiO2 and silicone, and a ratio of TiO2:silicone in the reflective wall can range between and including about 1:1 and about 3:1. The reflective wall can have a thickness between and including about 50 micrometers (µm) and about 400 µm. The reflective wall can have a thickness of about 250 µm, a ratio of TiO2:silicone of about 1:1, and becan configured to block substantially all light emitted toward the reflective wall from the LED. The LED device can further comprise a Phos hat disposed above the upper surface of the LED. The LED device can have a beam angle of a light output from the LED device that is reduced by about 10° to about 20° compared to a LED device without the reflective wall. The beam angle of the light output from the LED device can be about 115° or less. The submount can comprise a metal material. The reflective wall can be configured to be optically thick to prevent light leakage therethrough. The reflective wall can comprise layers of black and white materials configured to optimize reflectivity of light emitted from the LED.

In some aspects, a light emitting diode (LED) device comprises a singulated die positioned on a package wafer, an encapsulant surrounding the singulated die, and a reflective wall surrounding the encapsulant that surrounds the singulated die, wherein at least a portion of or all of an upper surface of the reflective wall is substantially coplanar with at least a portion of or all of an upper surface of the encapsulant. The reflective wall can be disposed around an outside edge of the singulated die on the package wafer. The encapsulant can comprise an epoxy-based or silicone-based curable resin or other polymeric matrix. The reflective wall can comprise TiO2. The reflective wall can comprise TiO2 and silicone, and wherein a ratio of TiO2:silicone in the reflective wall is about 1:1. The reflective wall can comprise TiO2 and silicone, and wherein a ratio of TiO2:silicone in the reflective wall ranges between and including about 1:1 and about 3:1. The reflective wall can have a thickness between and including about 50 micrometers (µm) and about 400 µm. The reflective wall can comprise TiO2 and silicone, wherein the reflective wall has a thickness of about 250 µm and a ratio of TiO2:silicone of about 1:1, and wherein the reflective wall is configured to block substantially all light emitted toward the reflective wall from the LED. The LED device can further comprise a Phos hat disposed above the upper surface of the LED. A beam angle of a light output from the LED device can be substantially reduced compared to a LED device without the reflective wall. A beam angle of the light output from the LED device can be about 115° or less.

In some aspects, a method of making a light emitting diode (LED) device comprises providing a ceramic submount, attaching a plurality of die to the ceramic substrate, applying an encapsulant on an upper surface of the die and/or the ceramic submount in a flat mold, singulating the plurality of die attached to the ceramic substrate to form separate die components, arranging the separate die components into an array in a mold, flooding a space around the separate die components that are arranged in the array with a reflective material to surround the separate die components, and cutting through the reflective material around the separate die components to singulate the separate die components to provide a LED device comprising at least one of the separate die components surrounded by a wall formed from the reflective material. The method can further comprise curing the reflective material prior to cutting through the reflective material. The encapsulant can comprise phosphorus. The reflective material can comprise TiO2. The reflective material can comprise TiO2 and silicone, and wherein a ratio of TiO2:silicone in the reflective wall is about 1:1. The reflective material can comprise TiO2 and silicone, and wherein a ratio of TiO2:silicone in the reflective material ranges between and including about 1:1 and about 3:1. The wall formed from the reflective material can be disposed around an outside edge of the submount. The wall of reflective material can have a thickness between and including about 50 micrometers (µm) to about 400 µm. The reflective material can comprise TiO2 and silicone, wherein the wall of reflective material has a thickness of about 250 µm and a ratio of TiO2:silicone of about 1:1, and wherein the wall of reflective material blocks substantially all light emitted toward the wall of reflective material from the LED. A beam angle of a light output from the LED device can be substantially reduced compared to a LED device without the wall of reflective material. A beam angle of the light output from the LED device can be about 115° or less.

In some aspects, a method of making a light emitting diode (LED) device can comprise providing a plurality of LED chips, wherein each of the plurality of LED chips comprise an upper surface, a lower surface, and one or more sides, applying each of the plurality of LED chips to a thermal release tape in a mold, wherein each of the plurality of LED chips are applied with the upper surface facing down, towards a contact surface of the thermal release tape, flooding a space around each of the plurality of LED chips in the mold with a reflective material to surround the one or more sides of the plurality of LED chips with the reflective material, curing the reflective material to form a puck comprising the reflective material with the plurality of LED chips embedded therein, the puck being in contact to the thermal release tape, and removing the puck from the thermal release tape and applying the puck to a substrate to form a LED device comprising a plurality of spaced apart LED chips surrounded by reflective material. Each of the plurality of LED chips can comprise wire bonds on the upper surface thereof. The method can comprise flooding the space around each of the plurality of LED chips in the mold with a reflective material to surround the one or more sides of the plurality of LED chips with the reflective material further comprises applying the reflective material at least up to the lower surface of each of the plurality of LED chips that is facing up, away from the contact surface of the thermal release tape. The method can comprise applying the puck to a substrate to form a LED device comprising a plurality of spaced apart LED chips surrounded by reflective material further comprises flipping the puck over so that the upper surfaces of the plurality of LED chips are facing up, away from the substrate, before applying the puck to the substrate. The method can further comprise electrically connecting the plurality of LED chips on the LED device via wire bonds. The method can further comprise curing the reflective material. The substrate can comprise a ceramic substrate. The substrate can comprise a metal substrate. The reflective material can comprise TiO2. The reflective material can comprise TiO2 and silicone, and wherein a ratio of TiO2:silicone in the reflective material is about 1:1. The reflective material can comprise TiO2 and silicone, and wherein a ratio of TiO2:silicone in the reflective material ranges between and including about 1:1 and about 3:1.

In some aspects, a method of making a light emitting diode (LED) device comprises providing a die positioned on a package wafer, shaping an outer edge of the die on the package wafer using a blade; and applying a reflective material around the shaped outer edge of the die on the packaged wafer to create a wall of reflective material. Shaping the outer edge of the die on the package wafer can comprise using a beveled blade to make a bevel cut from a bottom side of the die on the package wafer to form a bevel edge with an inclined angle. The wall of reflective material can be applied to the beveled edge to form a wall of reflective material having a thickness at a bottom of the wall greater than at a top thereof. The reflective material can comprise TiO2. The reflective material can comprise TiO2 and silicone, and wherein a ratio of TiO2:silicone in the reflective material is about 1:1. The reflective material can comprise TiO2 and silicone, and wherein a ratio of TiO2:silicone in the reflective material ranges between and including about 1:1 and about 3:1.

While the subject matter has been described herein with reference to specific aspects, features, and illustrative embodiments, it will be appreciated that the utility of the subject matter is not thus limited, but rather extends to and encompasses numerous other variations, modifications, and alternative embodiments, as will suggest themselves to those of ordinary skill in the field of the present subject matter, based on the disclosure herein.

Aspects disclosed herein can, for example, and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications, and alternative embodiments, within its scope and including equivalents of the claimed features.

What is claimed is:

1. A method of making a light emitting diode (LED) device, the method comprising:
    attaching a die to a substrate;
    applying an encapsulant on an upper surface of the die and/or substrate, wherein the encapsulant surrounds the die attached to the substrate and forms an upper surface of the encapsulant;
    singulating the die attached to the substrate to form separate die components;
    mounting the singulated die components to a release substrate;
    applying a reflective material to surround the singulated die components, wherein an upper surface of the reflective material is substantially coplanar with the upper surface of the encapsulant; and
    cutting through the reflective material to singulate the die components to provide a LED device comprising a singular die component surrounded by a wall of reflective material.

2. The method of claim 1, wherein the release substrate comprises thermal release tape.

3. The method of claim 1, wherein the encapsulant comprises an epoxy-based or silicone-based curable resin or other polymeric matrix.

4. The method of claim 1, wherein the reflective material comprises $TiO_2$.

5. The method of claim 1, wherein the reflective material comprises $TiO_2$ and silicone, and wherein a ratio of $TiO_2$:silicone in the reflective wall is about 1:1.

6. The method of claim 1, wherein the reflective material comprises $TiO_2$ and silicone, and wherein a ratio of $TiO_2$:silicone in the reflective material ranges between and including about 1:1 and about 3:1.

7. The method of claim 1, wherein the reflective wall is disposed around an outside edge of the substrate.

8. The method of claim 1, wherein the wall of reflective material has a thickness between and including about 50 micrometers (μm) to about 400 μm.

9. The method of claim 1, wherein the reflective wall has a thickness of about 250 μm and a ratio of $TiO_2$:silicone of about 1:1, wherein the reflective wall blocks substantially all light emitted from the LED and directed toward the reflective wall.

10. The method of claim 1, wherein a beam angle of a light output from the LED device is substantially reduced compared to a LED device without the reflective wall.

11. The method of claim 10, wherein a beam angle of the light output from the LED device is about 115° or less.

12. A method of making a light emitting diode (LED) device comprising:
attaching a die to a substrate;
applying an encapsulant on an upper surface of the die and/or the substrate;
singulating the die attached to the substrate by a first cutting through the encapsulant up to the substrate to form a channel separating a plurality of singulated die components along the substrate;
applying a reflective material to surround the plurality of singulated die components, forming a white wall; and
cutting through the reflective material and the substrate by a second cutting to singulate the plurality of singulated die components to provide a LED device surrounded by the reflective material.

13. The method of claim 12, wherein the encapsulant comprises phosphorus.

14. The method of claim 12, wherein the reflective material comprises $TiO_2$.

15. The method of claim 12, wherein the reflective material comprises $TiO_2$ and silicone, and wherein a ratio of $TiO_2$:silicone in the reflective material is about 1:1.

16. The method of claim 12, wherein the reflective material comprises $TiO_2$ and silicone, and wherein a ratio of $TiO_2$:silicone in the reflective material ranges between and including about 1:1 and about 3:1.

17. The method of claim 12, wherein the reflective material has a thickness between and including about 50 micrometers (μm) to about 400 μm.

18. The method of claim 12, wherein the reflective material comprises $TiO_2$ and silicone, wherein the reflective material has a thickness of about 250 μm and a ratio of $TiO_2$:silicone of about 1:1, and wherein the reflective material is configured to block substantially all light emitted toward the reflective wall from the LED.

19. The method of claim 12, wherein a beam angle of a light output from the LED device is substantially reduced compared to a LED device without the reflective material.

20. The method of claim 19, wherein a beam angle of the light output from the LED device is about 115° or less.

21. The method of claim 12, wherein the first cutting comprises use of a blade that is wider than a blade that is used to make the second cutting.

22. The method of claim 12, wherein an outside edge of the reflective material is substantially coplanar with an outside edge of the substrate.

* * * * *